US011196002B2

(12) United States Patent
Kawasaki et al.

(10) Patent No.: US 11,196,002 B2
(45) Date of Patent: Dec. 7, 2021

(54) METHOD FOR PRODUCING VAPOR DEPOSITION MASK, METHOD FOR PRODUCING ORGANIC SEMICONDUCTOR ELEMENT, AND METHOD FOR PRODUCING ORGANIC EL DISPLAY

(71) Applicant: Dai Nippon Printing Co., Ltd., Tokyo (JP)

(72) Inventors: Hiroshi Kawasaki, Tokyo (JP); Katsunari Obata, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/337,058

(22) PCT Filed: Oct. 4, 2017

(86) PCT No.: PCT/JP2017/036161
§ 371 (c)(1),
(2) Date: Mar. 27, 2019

(87) PCT Pub. No.: WO2018/066611
PCT Pub. Date: Apr. 12, 2018

(65) Prior Publication Data
US 2020/0035923 A1 Jan. 30, 2020

(30) Foreign Application Priority Data
Oct. 6, 2016 (JP) .............................. JP2016-198191

(51) Int. Cl.
*H01L 51/00* (2006.01)
*H01L 51/56* (2006.01)

(52) U.S. Cl.
CPC .......... *H01L 51/0011* (2013.01); *H01L 51/56* (2013.01)

(58) Field of Classification Search
CPC . H01L 51/0011; H01L 51/56; H01L 51/5012; H01L 51/0021; H01L 51/5221;
(Continued)

(56) References Cited

U.S. PATENT DOCUMENTS 6,255,775 B1 7/2001 Ikuko et al.
6,716,656 B2 * 4/2004 Shtein .................. C23C 14/042
438/24
(Continued)

FOREIGN PATENT DOCUMENTS

CN 105143497 A 12/2015
JP H10-319870 A1 12/1998
(Continued)

OTHER PUBLICATIONS

English translation of JP 2015120947 A (Year: 2015).*
(Continued)

*Primary Examiner* — Ibrahime A Abraham
*Assistant Examiner* — Chris Q Liu
(74) *Attorney, Agent, or Firm* — Burr & Brown, PLLC

(57) ABSTRACT

In a method for producing a vapor deposition mask including a resin mask 20 including resin mask openings 25 corresponding to a pattern to be produced by vapor deposition, and a metal mask 10 including a metal mask opening 15, the metal mask being stacked on one surface of the resin mask, when the plurality of resin mask openings 25 are formed, as to any one resin mask opening 25a of the plurality of resin mask openings 25, the resin mask opening 25 is formed such that in a thicknesswise cross section of the resin mask, an acute angle ($\theta$1) formed by one inner wall surface forming the one resin mask opening and the other surface of the resin mask is different from an acute angle ($\theta$2) formed by the other inner wall surface forming the one resin mask opening and the other surface of the resin mask.

8 Claims, 14 Drawing Sheets

(58) Field of Classification Search
CPC ............... H01L 51/001; H01L 51/0004; H01L 51/0008; H01L 51/0013; H01L 51/5024; H01L 51/5036; H01L 51/504; H01L 51/5206; H01L 51/5265
USPC .................................................... 219/121.71
See application file for complete search history.

(56) References Cited

U.S. PATENT DOCUMENTS

| | | | | |
|---|---|---|---|---|
| 7,537,810 | B2* | 5/2009 | Hayashi | G03F 7/0007 428/1.1 |
| 8,461,058 | B2* | 6/2013 | Prushinskiy | C23C 14/568 438/758 |
| 8,664,016 | B2* | 3/2014 | Chun | H01L 51/5265 438/22 |
| 9,087,951 | B2* | 7/2015 | Ye | H01L 31/1804 |
| 9,614,192 | B2* | 4/2017 | Kaplan | H01L 51/0004 |
| 2013/0186330 | A1 | 7/2013 | Lee et al. | |
| 2014/0377903 | A1 | 12/2014 | Takeda et al. | |
| 2015/0037928 | A1 | 2/2015 | Hirobe et al. | |
| 2016/0115580 | A1* | 4/2016 | Mizumura | C23F 1/02 118/720 |
| 2016/0168691 | A1 | 6/2016 | Takeda et al. | |
| 2016/0281209 | A1 | 9/2016 | Mizumura | |
| 2018/0053894 | A1 | 2/2018 | Miyadera et al. | |

FOREIGN PATENT DOCUMENTS

| | | |
|---|---|---|
| JP | 2010-174305 A1 | 8/2010 |
| JP | 2010-188418 A1 | 9/2010 |
| JP | 2013-147739 A1 | 8/2013 |
| JP | 2013-165058 A1 | 8/2013 |
| JP | 5288072 B2 | 9/2013 |
| JP | 2015-120947 A1 | 7/2015 |
| JP | 2016-145420 A | 8/2016 |

OTHER PUBLICATIONS

International Search Report and Written Opinion (Application No. PCT/JP2017/036161) dated Jan. 9, 2018.
Chinese Office Action (Application No. 201780061439.7) dated Jul. 31, 2020 (with English translation).

* cited by examiner

VIEW SEEN FROM RESIN MASK SIDE

VIEW SEEN FROM RESIN MASK SIDE

METHOD FOR PRODUCING VAPOR DEPOSITION MASK, METHOD FOR PRODUCING ORGANIC SEMICONDUCTOR ELEMENT, AND METHOD FOR PRODUCING ORGANIC EL DISPLAY

TECHNICAL FIELD

Embodiments of the present disclosure relate to a method for producing a vapor deposition mask, a method for producing an organic semiconductor element, and a method for producing an organic EL display.

BACKGROUND ART

Formation of a vapor deposition pattern using a vapor deposition mask is typically performed by bringing the vapor deposition mask in which openings corresponding to a pattern to be produced by vapor deposition are provided into close contact with a vapor deposition target, and causing a vapor deposition material released from a vapor deposition source to adhere onto the vapor deposition target through the openings.

As the aforementioned vapor deposition mask used for forming the vapor deposition pattern, for example, there is known a vapor deposition mask including: a resin mask including resin mask openings corresponding to a pattern to be produced by vapor deposition; and a metal mask including a metal mask opening (sometimes referred to as slit), the resin mask and the metal mask being stacked (for example, refer to Patent Document 1). Moreover, a vapor deposition mask made of metal (shadow mask) is also known (for example, Patent Document 2).

CITATION LIST

Patent Document

Patent Document 1: Japanese Patent No. 5288072
Patent Document 2: Japanese Patent Laid-Open No. 10-319870

SUMMARY

Technical Problem

A primary object of an embodiment of the present disclosure is to provide, for a vapor deposition mask in which a resin mask and a metal mask are stacked and a frame-equipped vapor deposition mask in which the vapor deposition mask is fixed to a frame, a method for producing a vapor deposition mask capable of forming a vapor deposition pattern with further higher definition, and moreover, to provide a method for producing an organic semiconductor element capable of producing an organic semiconductor element with excellent precision and a method for producing an organic EL display capable of producing an organic EL display with excellent precision.

Solution to Problem

A method for producing a vapor deposition mask of an embodiment of the present disclosure is a method for producing a vapor deposition mask including a resin mask including resin mask openings corresponding to a pattern to be produced by vapor deposition, and a metal mask including a metal mask opening, the metal mask being stacked on one surface of the resin mask, the method including: a step of preparing a metal mask-equipped resin plate in which the metal mask is stacked on one surface of a resin plate; and a step of forming a plurality of resin mask openings in the resin plate by radiating a laser through the metal mask opening of the metal mask-equipped resin plate, wherein in the step of forming the resin mask openings, as to any one resin mask opening of the plurality of resin mask openings, the resin mask opening is formed such that in a thicknesswise cross section of the resin mask, an acute angle formed by one inner wall surface forming the one resin mask opening and the other surface of the resin mask is different from an acute angle formed by the other inner wall surface forming the one resin mask opening and the other surface of the resin mask.

Moreover, a method for producing a vapor deposition mask of another embodiment of the present disclosure is a method for producing a vapor deposition mask including a resin mask including resin mask openings corresponding to a pattern to be produced by vapor deposition, and a metal mask including a metal mask opening, the metal mask being stacked on one surface of the resin mask, the method including: a step of preparing a metal mask-equipped resin plate in which the metal mask is stacked on one surface of a resin plate; and a step of forming a plurality of resin mask openings in the resin plate by radiating a laser through the metal mask opening of the metal mask-equipped resin plate, wherein in the step of forming the resin mask openings, the resin mask is formed such that in a thicknesswise cross section of the resin mask, an acute angle formed by one inner wall surface of inner wall surfaces forming one resin mask opening of the plurality of resin mask openings and the other surface of the resin mask is different from an acute angle formed by one inner wall surface of inner wall surfaces forming another resin mask opening and the other surface of the resin mask.

In the aforementioned method for producing a vapor deposition mask, in the step of forming the resin mask openings, the resin mask may be formed such that in a thicknesswise cross section of the resin mask, an acute angle formed by one inner wall surface forming the one resin mask opening and the other surface of the resin mask is different from an acute angle formed by the other inner wall surface forming the one resin mask opening and the other surface of the resin mask.

A method for producing a vapor deposition mask of another embodiment of the present disclosure is a method for producing a vapor deposition mask including openings corresponding to a pattern to be produced by vapor deposition, the method comprising: a step of preparing a resin plate; and a step of forming a plurality of openings in the resin plate by radiating a laser, wherein in the step of forming the openings, when a surface, of surfaces of the vapor deposition mask, that is positioned on a vapor deposition source side is regarded as one surface of the vapor deposition mask, as to any one opening of the plurality of openings, the opening is formed such that in a thicknesswise cross section of the vapor deposition mask, an acute angle formed by one inner wall surface forming the one opening and the other surface of the vapor deposition mask is different from an acute angle formed by the other inner wall surface forming the one opening and the other surface of the vapor deposition mask.

A method for producing a vapor deposition mask of another embodiment of the present disclosure is a method for producing a vapor deposition mask including openings corresponding to a pattern to be produced by vapor deposition, the method comprising: a step of preparing a resin plate; and a step of forming a plurality of openings in the resin plate by radiating a laser, wherein in the step of forming the openings, when a surface, of surfaces of the vapor deposition mask, that is positioned on a vapor deposition source side is regarded as one surface of the vapor deposition mask, the opening is formed such that in a thicknesswise cross section of the vapor deposition mask, an acute angle formed by one inner wall surface of inner wall surfaces forming one opening of the plurality of openings and the other surface of the vapor deposition mask is different from an acute angle formed by one inner wall surface of inner wall surfaces forming another opening and the other surface of the vapor deposition mask.

In the aforementioned method for producing a vapor deposition mask, in the step of forming the opening, the opening may be formed such that in a thicknesswise cross section of the vapor deposition mask, an acute angle formed by one inner wall surface forming the one opening and the other surface of the vapor deposition mask is different from an acute angle formed by the other inner wall surface forming the one opening and the other surface of the vapor deposition mask.

Moreover, there is provided a method for producing an organic semiconductor element of an embodiment of the present disclosure, including a vapor deposition pattern forming step of forming a vapor deposition pattern on a vapor deposition target using a vapor deposition mask, wherein the vapor deposition mask used in the vapor deposition pattern forming step is the aforementioned vapor deposition mask.

Moreover, according to an embodiment of the present disclosure, there is provided a method for producing an organic EL display, wherein the organic semiconductor element produced by the aforementioned producing method is used.

Advantageous Effects

According to the method for producing a vapor deposition mask of the present disclosure, a vapor deposition mask capable of forming a vapor deposition pattern with high definition can be produced. Moreover, according to the method for producing an organic semiconductor element according to the present disclosure, an organic semiconductor element can be produced with excellent precision. Moreover, according to the method for producing an organic EL display according to the present disclosure, an organic EL display can be produced with excellent precision.

DESCRIPTION OF EMBODIMENTS

Figure 1A:
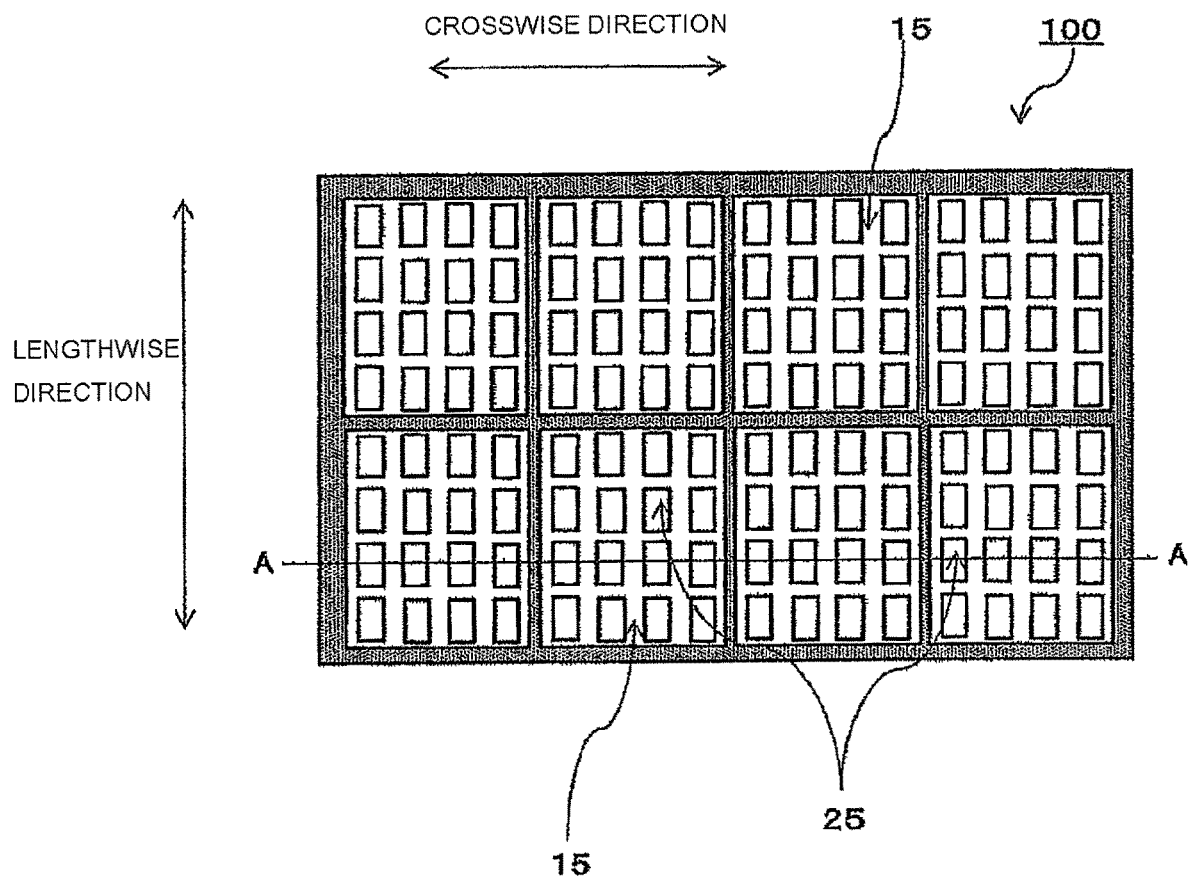
FIG. 1(a) is an elevation view exemplarily showing a vapor deposition mask of the present disclosure as seen from the metal mask side in plan view.

Hereafter, embodiments of the present invention are described with reference to the drawings and the like.

Notably, embodiments of the present invention can be implemented in many different modes and should not be construed to be limited to the contents of description of embodiments exemplified below. Moreover, while in the drawings, there are cases where widths, thicknesses, shapes of individual parts are schematically presented as compared with those in actual modes for more clarity of the description, they are merely exemplary, not limiting interpretation of an embodiment of the present invention. Moreover, in the specification of the present application and the drawings, elements similar to those described regarding already shown drawings are sometimes given the same signs to properly omit their detailed description. Moreover, while the description is made using terms such as "upward", "downward" and the like for convenience of the description, the upward and downward directions may be reversed. The same holds true for the rightward and leftward directions.

<<Vapor Deposition Mask>>

Figure 1B:
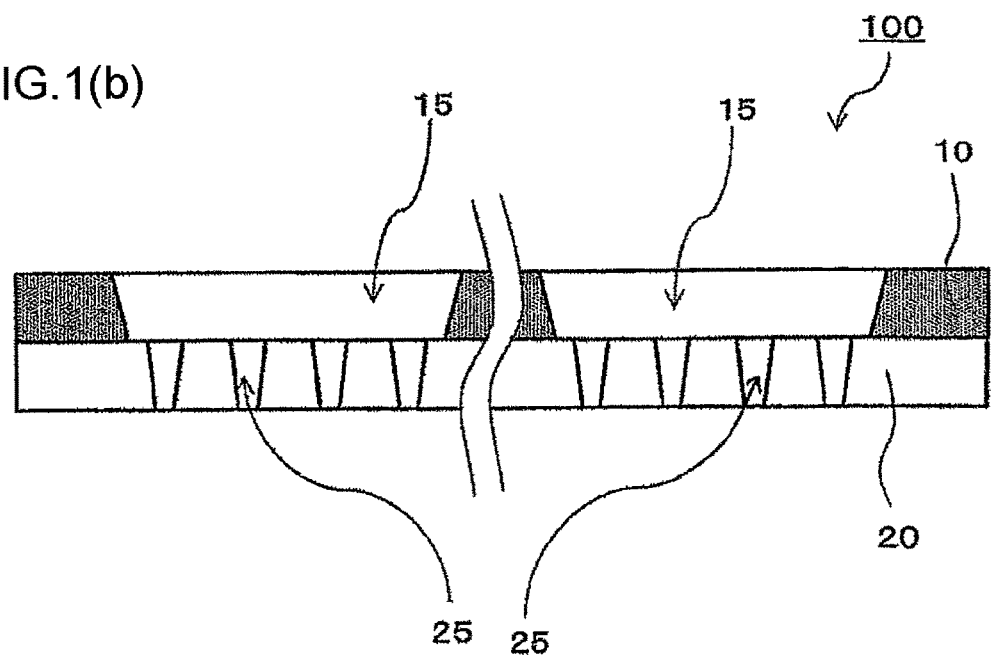
FIG. 1(b) is a schematic cross-sectional view of FIG. 1(a).

As shown in FIGS. 1(a) and 1(b), a vapor deposition mask 100 according to an embodiment of the present disclosure exhibits a configuration including: a resin mask 20 including a plurality of resin mask openings 25 corresponding to a pattern to be produced by vapor deposition; and a metal mask 10 including a metal mask opening 15, the resin mask and the metal mask being stacked such that the resin mask openings 25 overlap with the metal mask opening 15. Notably, FIG. 1(a) is an elevation view exemplarily showing a vapor deposition mask 100 according to an embodiment of the present disclosure as seen from the metal mask side in plan view, and FIG. 1(b) is a schematic cross-sectional view taken along the line A-A in FIG. 1(a).

Figure 2:
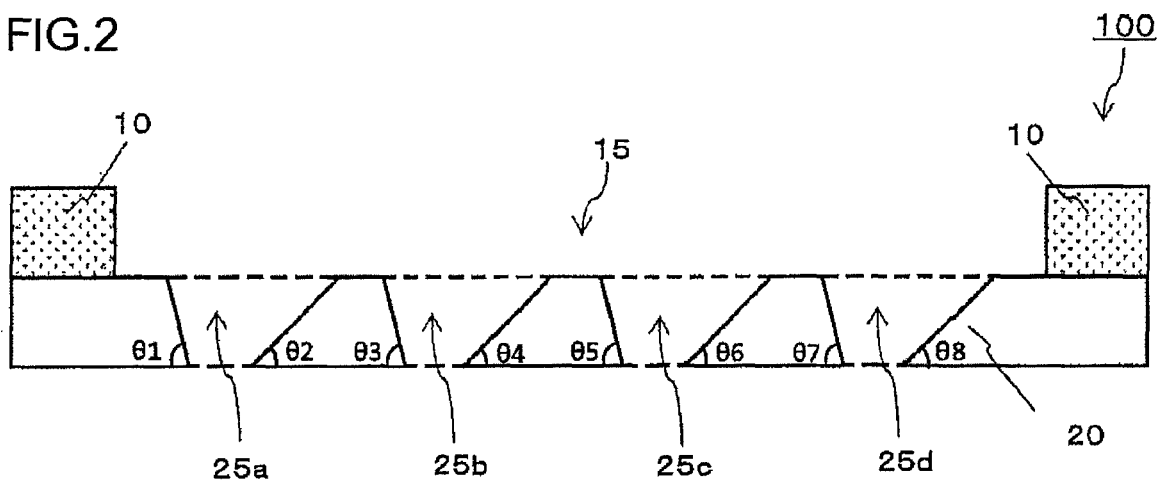
FIG. 2 is a schematic cross-sectional view exemplarily showing a vapor deposition mask of the present disclosure.

Further, in the vapor deposition mask 100 according to an embodiment of the present disclosure, the resin mask 20 includes the plurality of resin mask openings 25, and any one resin mask opening 25 (for example, a resin mask opening indicated by sign 25a in FIG. 2) of the plurality of resin mask openings 25 is configured such that in a thicknesswise cross section of the resin mask 20, an acute angle (for example, "θ1" of the resin mask opening indicated by sign 25a in FIG. 2) formed by one inner wall surface (in the mode shown in the figure, the inner wall surface positioned on the left side out of the opposing inner wall surfaces) forming the one resin mask opening 25 and the other surface of the resin mask 20 (in the mode shown in the figure, the lower surface of the resin mask) is different from an acute angle (for example, "θ2" of the resin mask opening indicated by sign 25a in FIG. 2) formed by the other inner wall surface (in the mode shown in the figure, the inner wall surface positioned on the right side out of the opposing inner wall surfaces) forming the one resin mask opening 25 and the other surface of the resin mask 20. Hereafter, the condition that satisfies this configuration is sometimes referred to as "condition A".

Figure 3:
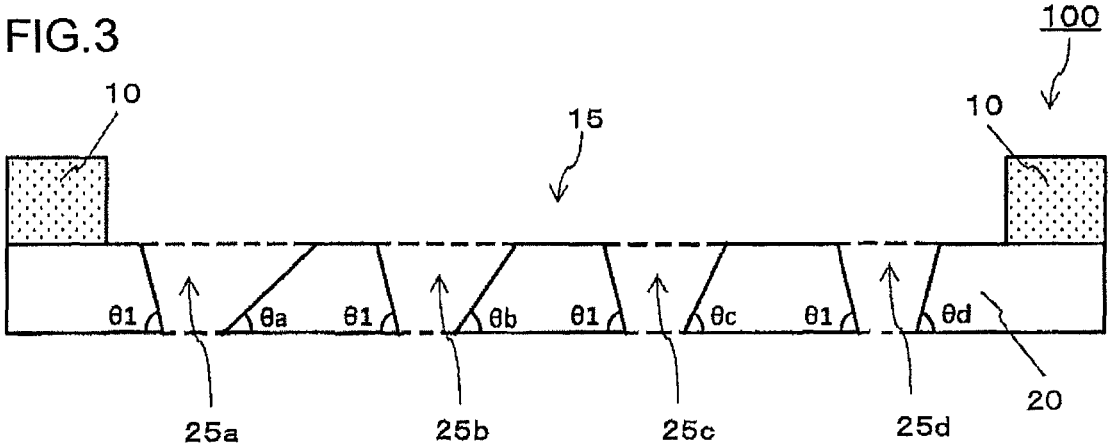
FIG. 3 is a schematic cross-sectional view exemplarily showing a vapor deposition mask of the present disclosure.

Moreover, in the vapor deposition mask 100 according to an embodiment of the present disclosure, in addition to the aforementioned configuration or in place of the aforementioned configuration, a configuration is made such that in a thicknesswise cross section of the resin mask 20, an acute angle (for example, "θa" of the resin mask opening indicated by sign 25a in FIG. 3) formed by one inner wall surface (in the mode shown in the figure, the inner wall surface positioned on the right side out of the opposing inner wall surfaces) of the inner wall surfaces forming one resin mask opening 25 (for example, the resin mask opening indicated by sign 25a in FIG. 3) of the plurality of resin mask openings 25 and the other surface of the resin mask 20 (in the mode shown in the figure, the lower surface of the resin mask) is different from an acute angle (for example, "θb" of the resin mask opening indicated by sign 25b in FIG. 3) formed by one inner wall surface (in the mode shown in the figure, the inner wall surface positioned on the right side out of the opposing inner wall surfaces) of the inner wall surfaces forming another resin mask opening 25 (for example, the resin mask opening indicated by sign 25b in FIG. 3) and the other surface of the resin mask 20 (in the mode shown in the figure, the lower surface of the resin mask). Hereafter, the condition that satisfies this configuration is sometimes referred to as "condition B". Moreover, in the thicknesswise cross section of the resin mask 20, an acute angle formed by an inner wall surface forming a resin mask opening 25 and the other surface of the resin mask 20 (surface thereof on the side that is not in contact with the metal mask) is sometimes referred to as "slope". Moreover, in the specification of the present application, in the thicknesswise cross section of the resin mask 20, one inner wall surface forming the one resin mask opening 25 and one inner wall surface forming another resin mask opening 25 mean that in the thicknesswise cross section of the resin mask 20, they are the inner wall surfaces positioned on the same direction side. The same holds true for other inner wall surfaces.

Notably, while in the mode shown in each figure, the shape of the inner wall surface of the resin mask opening 25 is a linear shape, it may be a shape other than the straight line, such, for example, as shapes with a curvature and with repeated mountain folds and valley folds. In such cases, the acute angle formed by the inner wall surface and the other surface of the resin mask only has to be an acute angle formed by an approximate curve (for example, linear approximation) of the shape of the inner wall surface and the other surface of the resin mask.

Figure 5:
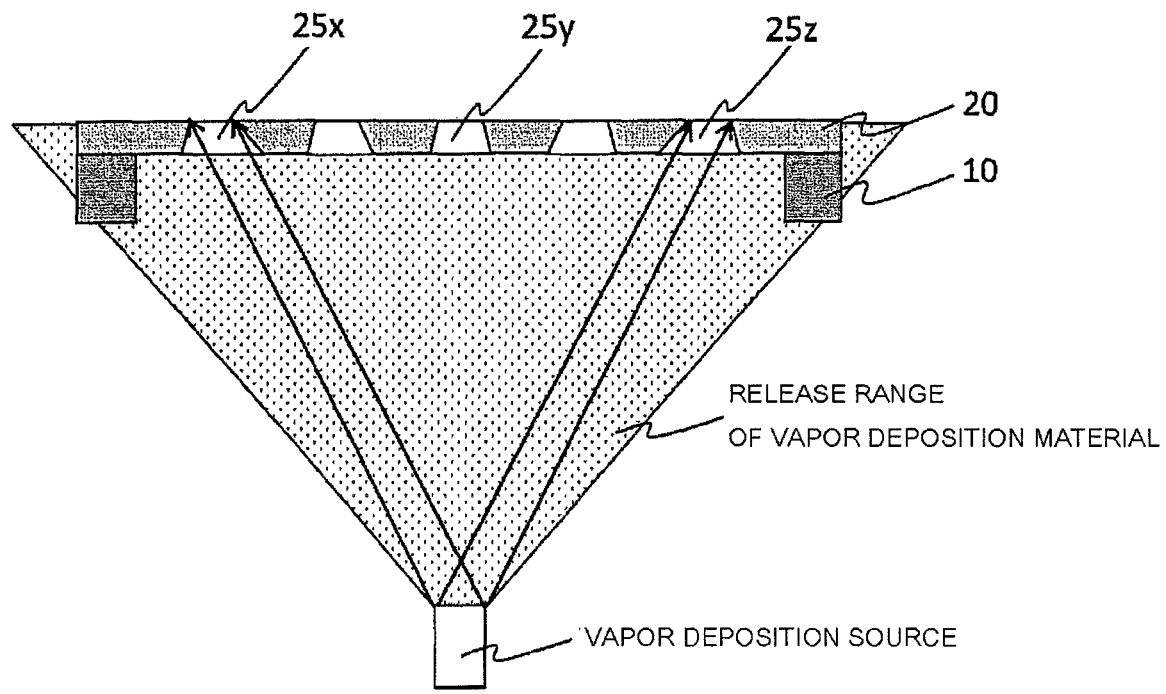
FIG. 5 is a diagram showing relation between a vapor deposition material released from a vapor deposition source and resin mask openings.
Figure 6:
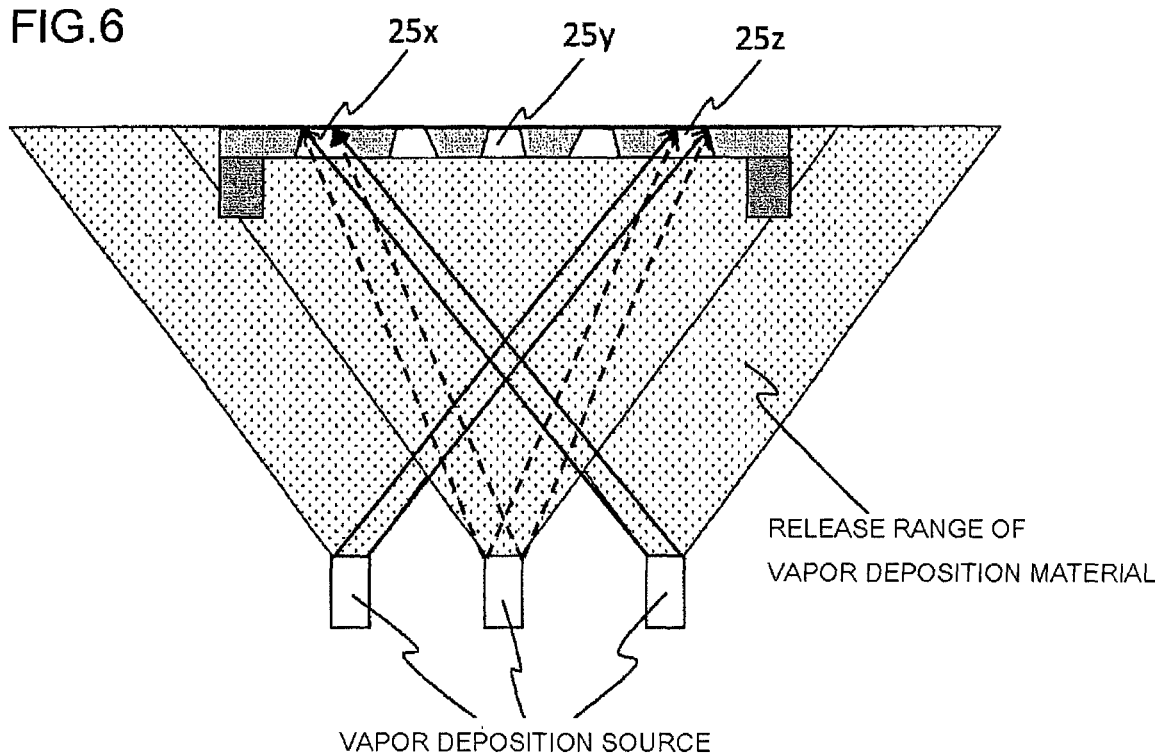
FIG. 6 is a diagram showing relation between a vapor deposition material released from a vapor deposition source and resin mask openings.

According to the vapor deposition mask 100 according to an embodiment of the present disclosure, in forming a vapor deposition pattern using the vapor deposition mask as shown in FIG. 5 or FIG. 6, generation of a shadow can be suppressed. Specifically, by properly arranging the resin mask openings 25 that satisfy any one or both of the aforementioned "condition A" and "condition B" in accordance with a release angle and the like of a vapor deposition material released from a vapor deposition source, generation of a shadow can be suppressed.

In short, the vapor deposition mask 100 according to an embodiment of the present disclosure can suppress generation of a shadow by making opening shapes of the resin mask openings 25 as the resin mask 20 is seen in cross-sectional view properly different in accordance with release angles of a vapor deposition material released from a vapor deposition source (refer to FIG. 5 and FIG. 6). Notably, each of FIG. 5 and FIG. 6 is a diagram showing relation between a vapor deposition material released from a vapor deposition source and the resin mask openings 25, in FIG. 5, the vapor deposition material is released from one vapor deposition source, and in FIG. 6, a mode in which the vapor deposition material is released from three vapor deposition sources is employed. Moreover, in FIG. 5 and FIG. 6, "slopes" of the resin mask openings 25 (for example, the resin mask openings indicated by signs 25x and 25z in FIG. 5 and FIG. 6) positioned at predetermined distances from the vapor deposition source(s) are made different from "slopes" of the resin mask openings (for example, the resin mask openings indicated by signs 25y in FIG. 5 and FIG. 6) positioned closer than those, and moreover, in one resin mask opening 25 (for example, each of the resin mask openings indicated by signs 25x and 25z in FIG. 5 and FIG. 6), a "slope" formed by one inner wall surface and the other surface of the resin mask is made different from a "slope" formed by the other inner wall surface forming the same resin mask opening (for example, each of the resin mask openings indicated by signs 25x and 25z in FIG. 5 and FIG. 6) and the other surface of the resin mask.

The vapor deposition source(s) are not limited to the modes shown in the figures but may be two or four or more vapor deposition sources. Moreover, they may be linear source vapor deposition sources which can scan vapor deposition sources in a predetermined direction. In any mode of the vapor deposition source(s), the resin mask openings 25 that satisfy any one or both of the aforementioned "condition A" and "condition B" are provided in the resin mask 20 with the release angles of the vapor deposition material released from the vapor deposition source(s) taken into consideration.

Notably, the shadow stated in the specification of the present application is a phenomenon that a part of a vapor deposition material released from a vapor deposition source collides with the vicinity of the resin mask opening 25 on one surface (lower surface in the mode shown in FIG. 5 or FIG. 6) of the resin mask 20 or with inner wall surfaces of the resin mask opening 25 and does not reach a vapor deposition target, and thereby, a portion without vapor deposition that has a film thickness smaller than the intended vapor deposition film thickness arises. Moreover, the inner wall surface of the resin mask opening 25 stated in the specification of the present application is a surface of the resin mask forming the resin mask opening 25 itself, in other words, a surface facing the space in the resin mask opening.

FIG. 2 is a schematic cross-sectional view exemplarily showing the vapor deposition mask 100 according to an embodiment of the present disclosure, and as the vapor deposition mask is seen in cross-sectional view, the resin mask 20 includes a resin mask opening 25a, a resin mask opening 25b, a resin mask opening 25c and a resin mask opening 25d as the resin mask openings 25. In the mode shown in FIG. 2, all the resin mask openings 25 include the same sectional shapes, and a "slope" formed by one inner wall surface forming one vapor deposition mask opening and the other surface of the resin mask 20 is different from a "slope" formed by the other inner wall surface forming the same resin mask opening 25 and the other surface of the resin mask 20. In other words, in the mode shown in FIG. 2, relation between the "slopes" in the resin mask opening 25a is $\theta 1 \ne \theta 2$, and $\theta 1 = \theta 3 = \theta 5 = \theta 7$ and $\theta 2 = \theta 4 = \theta 6 = \theta 8$ in relation between the resin mask opening 25a and the "slopes" of the other resin mask openings 25 (resin mask openings 25b, 25c and 25d).

In the mode shown in FIG. 2, the "slopes" may be in relation of $\theta 1 \ne \theta 3 \ne \theta 5 \ne \theta 7$ or in another one. For example, a configuration in which they are in relation of $\theta 1 \ne \theta 3 = \theta 5 \ne \theta 7$ or $\theta 1 = \theta 3 \ne \theta 5 = \theta 7$ can be employed. Moreover, while in the mode shown in FIG. 2, the resin mask openings 25 are provided so as to be in relation of $\theta 2 = \theta 4 = \theta 6 = \theta 8$, not limited to this relation, it only has to be determined with a release angle and the like of a vapor deposition material released from a vapor deposition source taken into consideration. In other words, it only has to be properly determined in accordance with a position and the like of the vapor deposition source. Notably, in view of improving an effect of suppressing generation of a shadow, a configuration in which the "slope" is smaller as the distance from the vapor deposition source is further is preferably employed.

For example, in the vapor deposition mask 100 in the mode shown in FIG. 3, the resin mask 20 includes the resin mask opening 25a, the resin mask opening 25b, the resin mask opening 25c and the resin mask opening 25d as the resin mask openings 25, and in each resin mask opening 25, the "slope" formed by one inner wall surface of the resin mask opening 25 and the other surface of the resin mask may be made the same as the others ("slopes" indicated by signs $\theta 1$ in FIG. 3), and the "slope" formed by one inner wall surface of each resin mask opening 25 and the other surface of the resin mask may be made different from the others ("slopes" indicated by signs $\theta a$, $\theta b$, $\theta c$ and $\theta d$ in FIG. 3 may be made different). Moreover, in place of the mode shown in FIG. 3, the "slopes" indicated by signs $\theta a$, $\theta b$, $\theta c$ and $\theta d$ in FIG. 3 may be made the same, and a part or all of the "slopes" indicated by signs $\theta 1$ in FIG. 3 may be made different.

Figure 4:
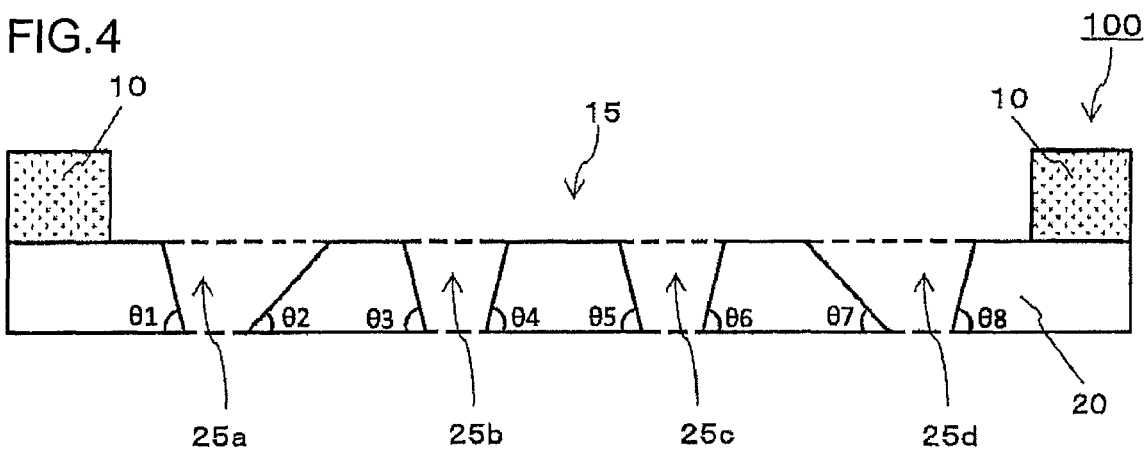
FIG. 4 is a schematic cross-sectional view exemplarily showing a vapor deposition mask of the present disclosure.

The vapor deposition mask 100 in the mode shown in FIG. 4 is in a mode in which there is supposed the case where a vapor deposition source is positioned on the reference line passing through the center in the width direction and on the metal mask side, the resin mask 20 includes the resin mask opening 25a, the resin mask opening 25b, the resin mask opening 25c and the resin mask opening 25d as the resin mask openings 25, and they are configured such that the "slope" $\theta 2$ of the resin mask opening 25a and the "slope" $\theta 7$ of the resin mask opening 25d are smaller than the "slope" $\theta 4$ of the resin mask opening 25b and the "slope" $\theta 6$ of the resin mask opening 25c.

Notably, in the mode shown in FIG. 4, the individual "slopes" may be made different. Moreover, a part of the "slopes" may be made the same.

The "slopes" of the resin mask openings 25 are not limited at all but only have to be properly determined with a release angle of a vapor deposition material released from a vapor deposition source taken into consideration. Notably, the "slope" of each resin mask opening 25 is preferably an angle smaller than the release angle of the vapor deposition material. A range of the "slope" by way of example is within a range not less than about 5° and not more than about 85°, and can be within a range not less than about 15° and not more than about 75°, within a range not less than about 25° and not more than about 65°, or within the similar range.

While in the mode shown in FIG. 1, the opening shape of the resin mask opening 25 as the vapor deposition mask 100 is seen from the metal mask side in plan view exhibits a rectangular shape, the opening shape is not specially limited but the opening shape of the resin mask opening 25 may be rhombic or polygonal or may be a shape having a curvature such as a circle and an ellipsoid. Notably, it can be said that the rectangular or polygonal opening shape is a preferable opening shape of the resin mask opening 25 in view of capability of securing a larger area of light emission as compared with the opening shape having a curvature such as a circle and an ellipsoid.

Moreover, in the case where the opening shape of the resin mask opening 25 is rectangular or polygonal, the thicknesswise cross section of the resin mask 20 stated in the specification of the present application means a thicknesswise cross section perpendicular to the inner wall surface of the opening, and in the case of a shape having a curvature such as a circle and ellipsoid, it means a thicknesswise cross section perpendicular to the tangential line thereof.

Hereafter, the resin mask 20 that satisfies the aforementioned "condition A" and/or "condition B", and the metal mask 10 are described, exemplified by specific examples.

<Resin Mask>

The material of the resin mask 20 is not limited but, for example, a material that enables formation of the resin mask openings 25 with high definition by laser processing or the like, includes a low rate of dimensional change and a low rate of humidity absorption under heat and with passage of time, and is light weight is preferably used. As such materials, a polyimide resin, a polyamide resin, a polyamide-imide resin, a polyester resin, a polyethylene resin, a polyvinyl alcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials exemplarily cited above, resin materials with the thermal expansion coefficients of about 16 ppm/° C. or less are preferable, resin materials with the rates of humidity absorption of about 1.0% or less are preferable, and resin materials including both conditions are particularly preferable. The resin mask using these resin materials enables dimensional precision of the resin mask openings 25 to be improved and a rate of dimensional change and a rate of humidity absorption under heat and with passage of time to be small.

The thickness of the resin mask 20 is not specially limited but, in the case of further improving the effect of suppressing generation of a shadow with the resin mask 20 including the resin mask openings that satisfy any one or both of the aforementioned "condition A" and "condition B", the thickness of the resin mask 20 is preferably not more than about 25 µm, still preferably less than about 10 µm. In particular, by setting the thickness of the resin mask 20 to be not less than about 3 µm and less than about 10 µm, still preferably not less than about 4 µm and not more than about 8 µm, the influence of a shadow in formation of a high definition pattern exceeding 400 ppi can be more effectively prevented. By setting the thickness of the resin mask 20 to be within a preferable range, defects such as a pinhole and occurrence of deformation or the like can be suppressed.

While the resin mask 20 may be directly bonded to the metal mask 10 mentioned later or may be bonded thereto via a pressure-sensitive adhesive agent layer, in the case where the resin mask 20 is bonded to the metal mask 10 via the pressure-sensitive adhesive agent layer, the total thickness of the resin mask 20 and the pressure-sensitive adhesive agent layer is preferably within the aforementioned preferable thickness range.

<Metal Mask>

As shown in FIG. 1(b), the metal mask 10 is stacked on one surface of the resin mask 20. The metal mask 10 is constituted of metal, in which the metal mask openings 15 extending in the lengthwise direction or the crosswise direction are arranged as shown in FIG. 1(a). An arrangement example of the metal mask opening 15 is not specially limited but the metal mask opening 15 extending in the lengthwise direction and the crosswise direction may be arranged in a plurality of rows in the lengthwise direction and the crosswise direction, the metal mask opening 15 extending in the lengthwise direction may be arranged in a plurality of rows in the crosswise direction, and the metal mask openings extending in the crosswise direction may be arranged in a plurality of rows in the lengthwise direction. Moreover, they may be arranged in only one row in the lengthwise direction or the crosswise direction. Moreover, the plurality of metal mask openings 15 may be arranged at random. Moreover, one metal mask opening 15 may be provided. Notably, "lengthwise direction" and "crosswise direction" stated in the specification of the present application indicate the vertical direction and the horizontal direction in the drawings, respectively, and may be any directions of the longitudinal directions and the width directions of the vapor deposition mask, the resin mask and the metal mask. For example, the longitudinal direction of the vapor deposition mask, the resin mask or the metal mask may be set to be the "lengthwise direction", or the width direction thereof may be set to be the "lengthwise direction". Moreover, while in the specification of the present application, the case where the shape of the vapor deposition mask in plan view is a rectangular shape is exemplarily described, it may be another shape such, for example, as a circular shape and a polygonal shape such as a rhombic shape. In this case, the longitudinal direction of the diagonal line, the radial direction, or any direction only has to be set as the "longitudinal direction", the direction perpendicular to the "longitudinal direction" being set as the "width direction (sometimes referred to as short-side direction)".

The material of the metal mask 10 is not specially limited but a conventionally known one in the field of the vapor deposition mask can be properly selected and used, and, for example, metal materials such as stainless steel, iron-nickel alloy and aluminum alloy can be cited. Above all, an invar material which is iron-nickel alloy can be preferably used since an invar material is hardly deformed by heat.

While the thickness of the metal mask 10 is not specially limited but, in order to more effectively prevent generation of a shadow, is preferably not more than about 100 µm, still preferably not more than about 50 µm, particularly preferably not more than about 35 µm. Notably, in the case of being thinner than about 5 µm, risks of rupture and deformation tend to increase and handling tends to be difficult.

Moreover, while in the mode shown in each figure, the shape of opening of the metal mask opening 15 in plan view exhibits a rectangular shape, the opening shape is not specially limited but the opening shape of the metal mask opening 15 may be any shape such as a trapezoid and a circle.

The sectional shape of the metal mask opening 15 formed in the metal mask 10 is not specially limited but, as shown in FIG. 1(b), is preferably a shape including broadening toward a vapor deposition source. More specifically, an angle formed by a straight line connecting the lower bottom distal end in the metal mask opening 15 of the metal mask 10 and the upper bottom distal end in the metal mask opening 15 of the same metal mask 10 and the bottom surface of the metal mask 10, in other words, an angle formed by an inner wall surface of the metal mask opening 15 and a surface of the metal mask 10 on the side that is in contact with the resin mask 20 (upper surface of the metal mask in the mode shown in the figure) in the thicknesswise cross section of the inner wall surface constituting the metal mask opening 15 of the metal mask 10 is preferably within a range not less than about 5° and not more than about 85°, still preferably within a range not less than about 15° and not more than about 80°, further preferably within a range not less than about 25° and not more than about 65°. In particular, within this range, it is preferably an angle smaller than a vapor deposition angle of a vapor deposition machine to be used.

Moreover, an opening space of the metal mask opening 15 may be partitioned by a bridge (not shown).

A method of stacking the metal mask 10 on one surface of the resin mask 20 is not specially limited but the resin mask 20 and the metal mask 10 may be pasted together using various pressure-sensitive adhesive agents or a resin mask with self-adhesion may be used. The dimensions of the resin mask 20 and the metal mask 10 may be the same as or different from each other. Notably, with fixation to a frame which is arbitrarily performed after that taken into consideration, the dimension of the resin mask 20 is preferably made smaller than that of the metal mask 10 to realize the state where the outer circumferential portion of the metal mask 10 is exposed, so that the metal mask 10 can be easily fixed to a frame.

Next, more preferable examples of a vapor deposition mask are specifically described, exemplified by Embodiment (A) and Embodiment (B).

Notably, the resin masks 20 of the vapor deposition masks 100 of Embodiment (A) and Embodiment (B) described below satisfy any one or both of the aforementioned "condition A" and "condition B".

<Vapor Deposition Mask of Embodiment (A)>

Figure 7:
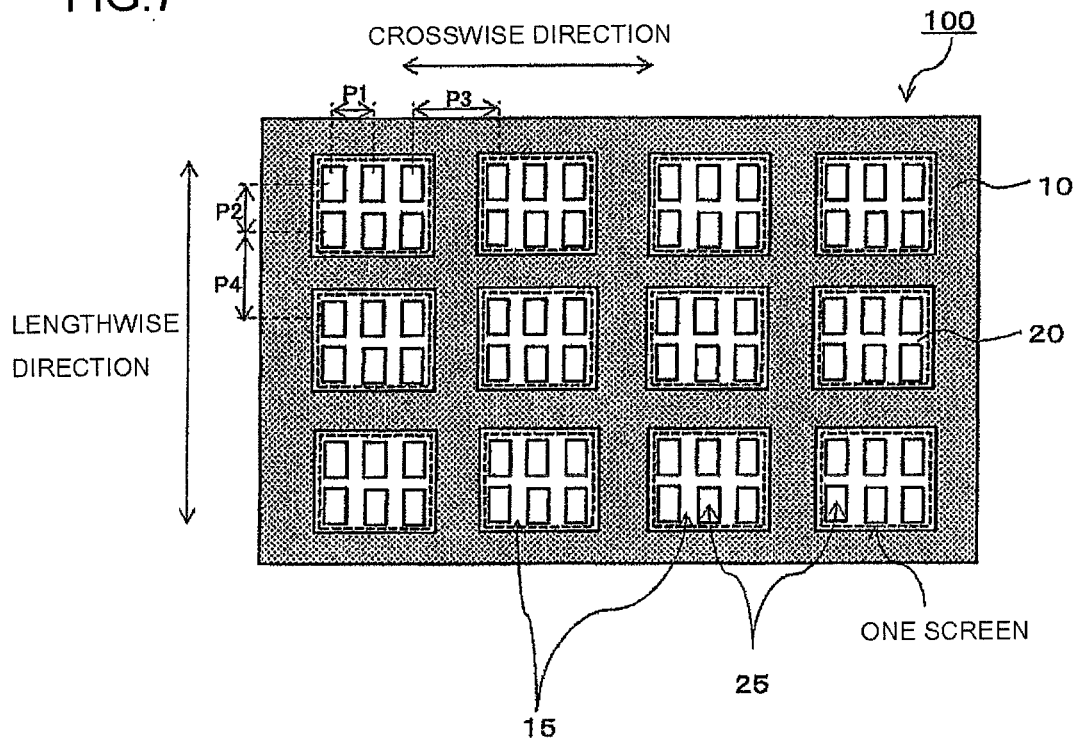
FIG. 7 is an elevation view exemplarily showing a vapor deposition mask of Embodiment (A) as seen from the metal mask side in plan view.
Figure 8:
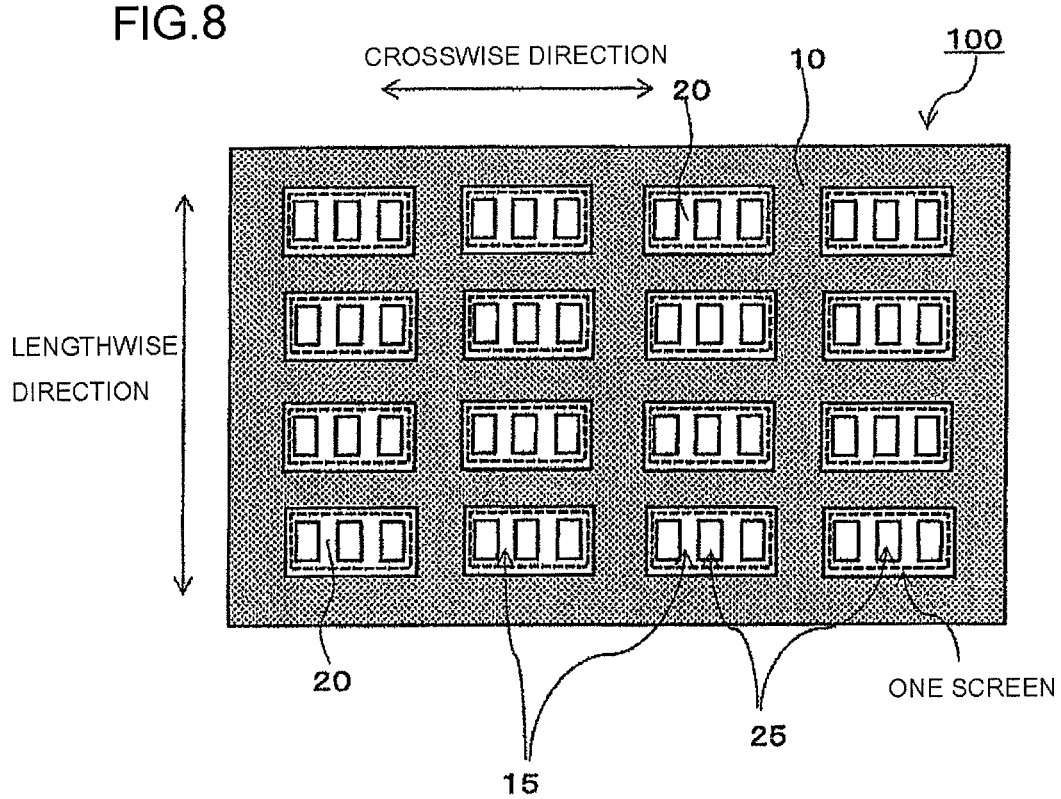
FIG. 8 is an elevation view exemplarily showing a vapor deposition mask of Embodiment (A) as seen from the metal mask side in plan view.
Figure 9:
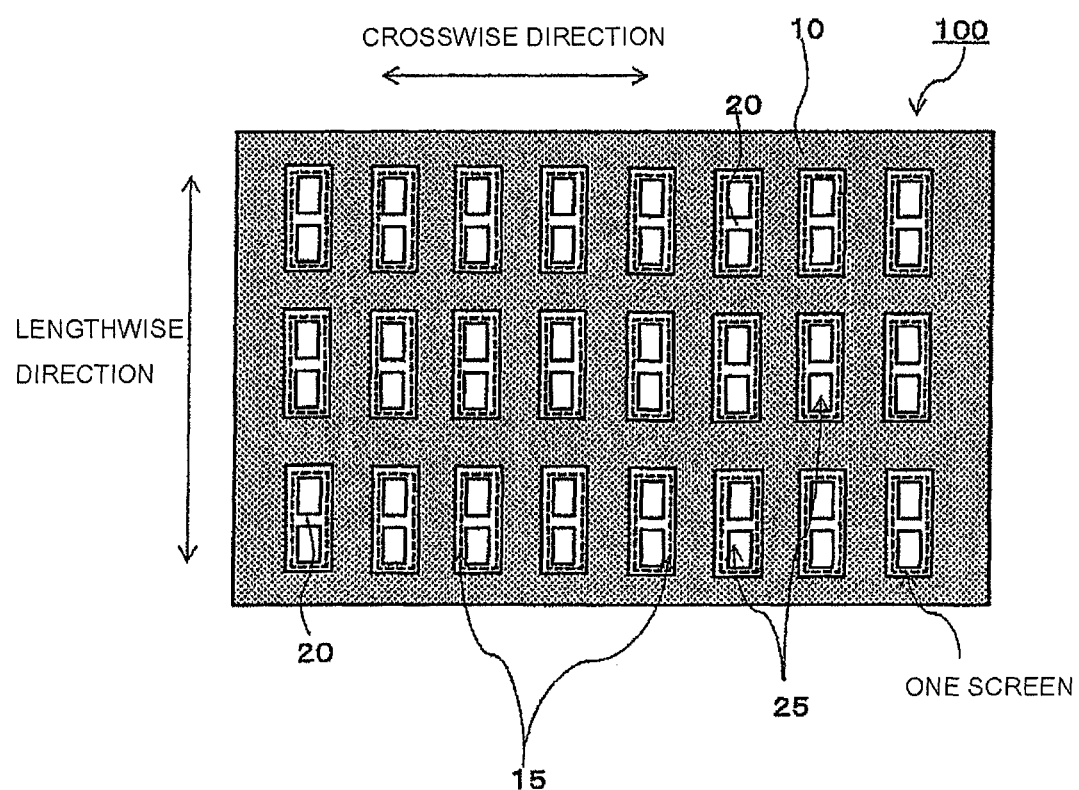
FIG. 9 is an elevation view exemplarily showing a vapor deposition mask of Embodiment (A) as seen from the metal mask side in plan view.

As shown in FIG. 7, the vapor deposition mask 100 of Embodiment (A) is a vapor deposition mask for simultaneously forming vapor deposition patterns for a plurality of screens, and includes the metal mask 10 in which the plurality of metal mask openings 15 are provided and the resin mask 20, the metal mask being stacked on one surface of the resin mask, wherein the resin mask openings 25 needed for constituting the plurality of screens are provided in the resin mask 20, and each metal mask opening 15 is provided at a position overlapping with the entirety of at least one screen.

The vapor deposition mask 100 of Embodiment (A) is a vapor deposition mask used for simultaneously forming vapor deposition patterns for a plurality of screens, and one vapor deposition mask 100 can simultaneously form vapor deposition patterns compatible with a plurality of products. "Resin mask openings" stated for the vapor deposition mask of Embodiment (A) mean the pattern(s) to be produced using the vapor deposition mask 100 of Embodiment (A). For example, when the vapor deposition mask is used for forming an organic layer in an organic EL display, the shape of the resin mask openings 25 is the shape of the organic layer. Moreover, "one screen" is constituted of an aggregate of the resin mask openings 25 corresponding to one product, and when the one product is an organic EL display, an aggregate of organic layers needed for forming the one organic EL display, in other words, an aggregate of resin mask openings 25 to be the organic layers is "one screen". Further, in the vapor deposition mask 100 of Embodiment (A), in order to simultaneously form the vapor deposition patterns for the plurality of screens, the aforementioned "one screen" is arranged for each of the plurality of screens in the resin mask 20 at predetermined intervals. Namely, in the resin mask 20, the resin mask openings 25 needed for constituting the plurality of screens are provided.

The vapor deposition mask of Embodiment (A) includes the metal mask 10 in which the plurality of metal mask openings 15 are provided and the resin mask, the metal mask being provided on one surface of the resin mask, wherein each metal mask opening is provided at a position overlapping with the entirety of at least one screen. In other words, between the resin mask openings 25 needed for constituting one screen, metal line portions that include the same length as the length of the metal mask opening 15 in the lengthwise direction and include the same thickness as that of the metal mask 10 between the resin mask openings 25 adjacent in the crosswise direction, or metal line portions that include the same length as the length of the metal mask opening 15 in the crosswise direction and include the same thickness as that of the metal mask 10 between the resin mask openings 25 adjacent in the lengthwise direction do not exist. Hereafter, the metal line portions that include the same length as the length of the metal mask opening 15 in the lengthwise direction and include the same thickness as that of the metal mask 10 and the metal line portions that include the same length as the length of the metal mask opening 15 in the crosswise direction and include the same thickness as that of the metal mask 10 are sometimes collectively referred to simply as metal line portions.

According to the vapor deposition mask 100 of Embodiment (A), even when the dimension of the resin mask openings 25 needed for constituting one screen and the pitch between the resin mask openings 25 constituting one screen are made small, for example, even when the dimension of the resin mask openings 25 and the pitch between the resin mask openings 25 are made extremely fine in order to form a screen exceeding 400 ppi, interference due to metal line portions can be prevented and an image with high definition can be formed. Notably, when one screen is divided by a plurality of metal mask openings, in other words, when the metal line portions including the same thickness as that of the metal mask 10 exist between the resin mask openings 25 constituting one screen, as the pitch between the resin mask openings 25 constituting one screen becomes smaller, the metal line portions existing between the resin mask openings 25 more become a hindrance in forming a vapor deposition pattern on a vapor deposition target and the vapor deposition pattern with high definition becomes more difficult to be formed. In other words, when the metal line portions including the same thickness as that of the metal mask 10 exist between the resin mask openings 25 constituting one screen, the metal line portions cause generation of a shadow when setting the frame-equipped vapor deposition mask, which results in difficulty of formation of a screen with high definition.

Next, referring to FIG. 7 to FIG. 10, the resin mask openings 25 constituting one screen are exemplarily described. Notably, a region enclosed by a broken line in the modes shown in the figures is one screen. While in the modes shown in the figures, an aggregate of a small number of resin mask openings 25 is one screen for convenience of description, but not limited to these modes, for example, the resin mask openings 25 for millions of pixels may exist in one screen, where one resin mask opening 25 is one pixel.

In the mode shown in FIG. 7, one screen is constituted of an aggregate, of resin mask openings 25, in which a plurality of resin mask openings 25 are provided in the lengthwise direction and the crosswise direction. In the mode shown in FIG. 8, one screen is constituted of an aggregate, of resin mask openings 25, in which a plurality of resin mask openings 25 are provided in the crosswise direction. Moreover, in the mode shown in FIG. 9, one screen is constituted of an aggregate, of resin mask openings 25, in which a plurality of resin mask openings 25 are provided in the lengthwise direction. Further, in FIG. 7 to FIG. 10, the metal mask opening 15 is provided at a position overlapping with the entirety of one screen.

Figure 10A:
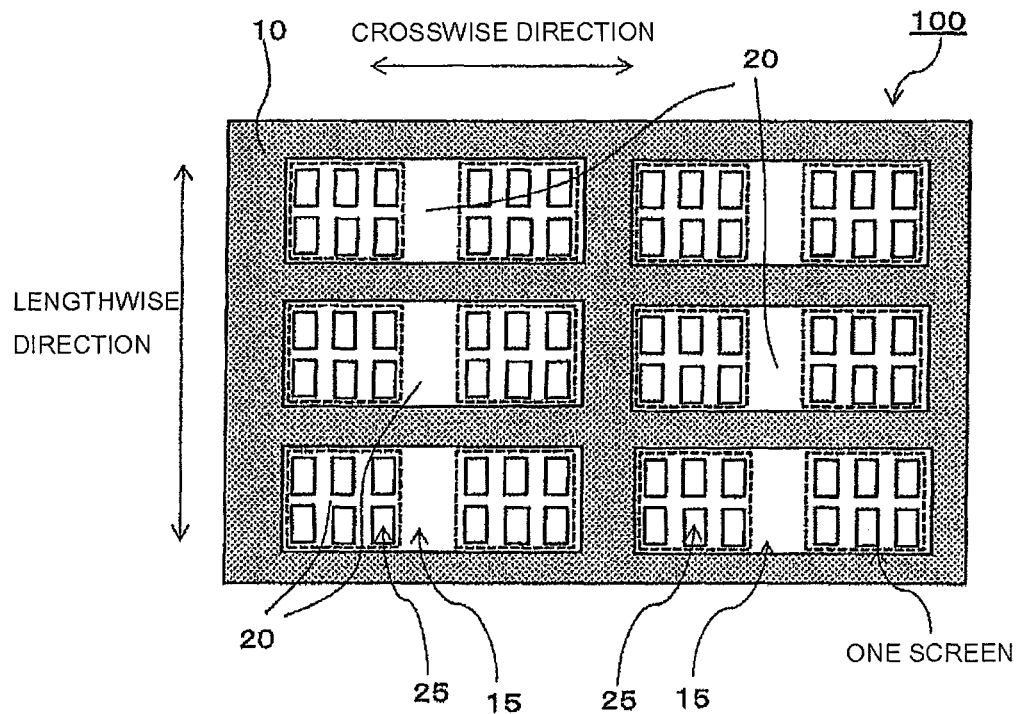
FIGS. 10(a) and 10(b) are elevation views exemplarily showing vapor deposition masks of Embodiment (A) as seen from the metal mask side in plan view.
Figure 10B:
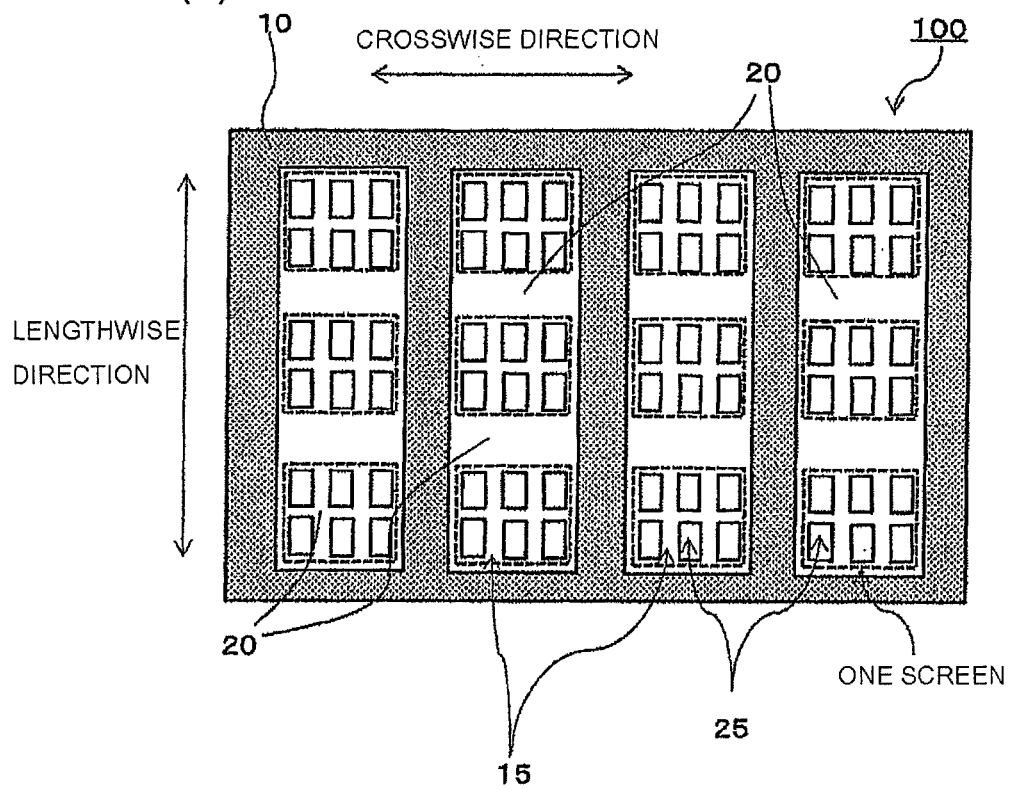

As described above, the metal mask opening 15 may be provided at a position overlapping with only one screen, or as shown in FIGS. 10(a) and 10(b), may be provided at a position overlapping with the entirety of two or more screens. In FIG. 10(a), in the vapor deposition mask 100 shown in FIG. 7, the metal mask opening 15 is provided at a position overlapping with the entirety of two screens continuous in the crosswise direction. In FIG. 10(b), the metal mask opening 15 is provided at a position overlapping with the entirety of three screens continuous in the lengthwise direction.

Next, exemplified by the mode shown in FIG. 7, pitches between the resin mask openings 25 constituting one screen and pitches between the screens are described. The pitches between the resin mask openings 25 constituting one screen and the dimension of the resin mask opening 25 are not specially limited but can be properly set depending on a pattern to be produced by vapor deposition. For example, when forming a vapor deposition pattern with high definition of 400 ppi, a pitch (P1) in the crosswise direction and a pitch (P2) in the lengthwise direction between the adjacent resin mask openings 25 out of the resin mask openings 25 constituting one screen are about 60 µm. Moreover, the dimension of the resin mask opening as one example is within a range not less than about 500 µm² and not more than about 1000 µm². Moreover, one resin mask opening 25 is not limited to correspond to one pixel but, for example, a plurality of pixels can also be collectively one resin mask opening 25 depending on a pixel arrangement.

While a pitch (P3) in the crosswise direction and a pitch (P4) in the lengthwise direction between the screens are not specially limited but, as shown in FIG. 7, when one metal mask opening 15 is provided at the position overlapping with the entirety of one screen, metal line portions are to exist between the screens. Accordingly, when the pitch (P4) in the lengthwise direction and the pitch (P3) in the crosswise direction between the screens are smaller than or substantially equal to the pitch (P2) in the lengthwise direction and the pitch (P1) in the crosswise direction of the resin mask openings 25 provided in one screen, the metal line portions existing between the screens are liable to break. Accordingly, with this point taken into consideration, the pitch (P3, P4) between the screens is preferably wider than the pitch (21, P2) between the resin mask openings 25 constituting one screen. The pitch (P3, P4) between the screens is exemplarily within a range not less than about 1 mm and not more than about 100 mm. Notably, the pitch between the screens means the pitch between the adjacent resin mask openings in one screen and another screen adjacent to the one screen. The same holds true for the pitch between the resin mask openings 25 and the pitch between the screens in the vapor deposition mask of Embodiment (B) mentioned later.

Notably, as shown in FIG. 10, when one metal mask opening 15 is provided at the position overlapping with the entirety of two or more screens, metal line portions constituting the inner wall surfaces of the metal mask opening are not to exist between the plurality of screens provided in the one metal mask opening 15. Accordingly, in this case, the pitch between the two or more screens provided at the position overlapping with the one metal mask opening 15 may be substantially equal to the pitch between the resin mask openings 25 constituting one screen.

Moreover, on the resin mask 20, grooves (not shown) extending in the lengthwise direction or the crosswise direction of the resin mask 20 may be formed. While in the case of application of heat in vapor deposition, there is a possibility that the resin mask 20 undergoes thermal expansion, and thereby, changes in dimension and position of the resin mask opening 25 arise, by forming the grooves, they can absorb the expansion of the resin mask, and can prevent the changes in dimension and position of the resin mask opening 25 caused by the resin mask 20 expanding in a predetermined direction as a whole due to accumulation of thermal expansions arising in portions in the resin mask. Formation positions of the grooves are not limited but they may be provided between the resin mask openings 25 constituting one screen and at positions overlapping with the resin mask openings 25, but they are preferably provided between the screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

Moreover, the grooves extending in the lengthwise direction may be between the adjacent screens, or the grooves extending in the crosswise direction may be formed between the adjacent screens. Furthermore, the grooves can also be formed in a mode combining these.

The depth and the width of the grooves are not specially limited but, since the rigidity of the resin mask 20 tends to decrease in the case where the depth of the grooves is too large and in the case where the width thereof is too large, they are needed to be set with this point taken into consideration. Moreover, the sectional shape of the grooves is not specially limited but only has to be arbitrarily selected as a U-shape, a V-shape or the like with the processing method and the like taken into consideration. The same holds true for the vapor deposition mask of Embodiment (B).

<Vapor Deposition Mask of Embodiment (B)>

Figure 11:
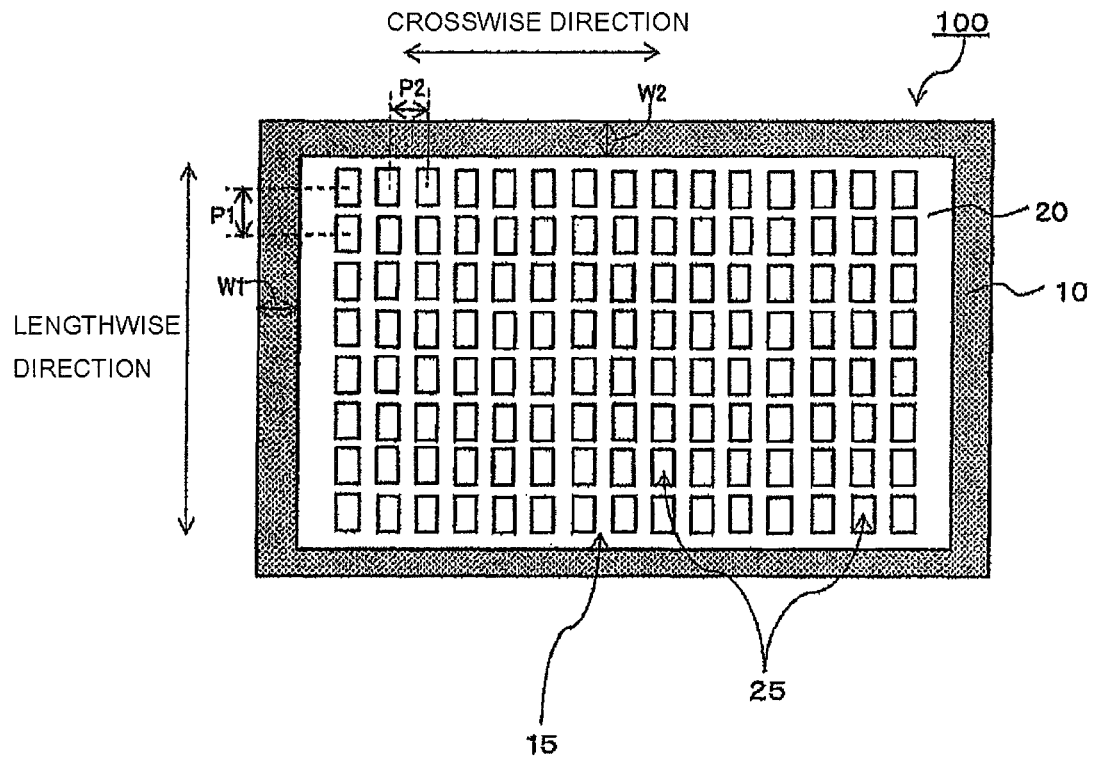
FIG. 11 is an elevation view exemplarily showing a vapor deposition mask of Embodiment (B) as seen from the metal mask side in plan view.

Next, a vapor deposition mask of Embodiment (B) is described. As shown in FIG. 11, a vapor deposition mask of Embodiment (B) includes the metal mask 10 in which one metal mask opening 15 is provided and the resin mask 20 in which the plurality of resin mask openings 25 corresponding to a pattern to be produced by vapor deposition are provided, the metal mask being stacked on one surface of the resin mask, wherein all of the plurality of resin mask openings 25 are provided at a position overlapping with the one metal mask opening 15 provided in the metal mask 10.

The resin mask openings 25 stated for the vapor deposition mask of Embodiment (B) mean resin mask openings needed for forming a vapor deposition pattern on a vapor deposition target, and resin mask openings not needed for forming the vapor deposition pattern on the vapor deposition target may be provided at a position not overlapping with the one metal mask opening 15. Notably, FIG. 11 is an elevation view which exemplarily shows the vapor deposition mask of Embodiment (B) and is of the vapor deposition mask as seen from the metal mask side in plan view.

In the vapor deposition mask 100 of Embodiment (B), the metal mask 10 including the one metal mask opening 15 is provided on the resin mask 20 including the plurality of resin mask openings 25, and all of the plurality of resin mask openings 25 are provided at a position overlapping with the one metal mask opening 15. In the vapor deposition mask 100 of Embodiment (B) with this configuration, metal line portions that include the same thickness as the thickness of the metal mask or a larger thickness than the thickness of the metal mask do not exist between the resin mask openings 25. Hence, as described for the aforementioned vapor deposition mask of Embodiment (A), a vapor deposition pattern with high definition can be formed to match the dimensions of the resin mask openings 25 provided in the resin mask 20 without suffering interference of metal line portions.

Moreover, according to the vapor deposition mask of Embodiment (B), there is almost no influence of a shadow even when the thickness of the metal mask 10 is made large. Hence, the thickness of the metal mask 10 can be made larger to such an extent that durability and handling ability are sufficiently satisfied. Durability and handling ability can be improved while enabling formation of a vapor deposition pattern with high definition.

The resin mask 20 in the vapor deposition mask of Embodiment (B) is constituted of resin, in which as shown in FIG. 11, the plurality of resin mask openings 25 corresponding to a pattern to be produced by vapor deposition are provided at a position overlapping with the one metal mask opening 15. The resin mask openings 25 correspond to the pattern to be produced by vapor deposition, and by a vapor deposition material which is released from a vapor deposition source passing through the resin mask openings 25, the vapor deposition pattern corresponding to the resin mask openings 25 is formed on the vapor deposition target.

Notably, while in the mode shown in the figure, the resin mask openings arranged in a plurality of rows in the lengthwise direction and the crosswise direction are exemplarily described, they may be arranged only in the lengthwise direction or in the crosswise direction.

"One screen" in the vapor deposition mask 100 of Embodiment (B) means an aggregate of resin mask openings 25 corresponding to one product, and when the one product is an organic EL display, an aggregate of organic layers needed for forming one organic EL display, in other words, an aggregate of resin mask openings 25 to be the organic layers is "one screen". While the vapor deposition mask of Embodiment (B) may be constituted of only "one screen" or may be provided by arranging the "one screen" for each of a plurality of screens, in the case where the "one screen" is arranged for each of the plurality of screens, the resin mask openings 25 are preferably provided at predetermined intervals on a screen-by-screen basis (refer to FIG. 7 for the vapor deposition mask of Embodiment (A)). The mode of "one screen" is not specially limited but, for example, the one screen can also be constituted of millions of resin mask openings 25, where one resin mask opening 25 is one pixel.

The metal mask 10 in the vapor deposition mask 100 of Embodiment (B) is constituted of metal and includes the one metal mask opening 15. Further, in the vapor deposition mask 100 of Embodiment (B), the one metal mask opening 15 is disposed at a position overlapping with all of the resin mask openings 25 as seen head-on of the metal mask 10, in other words, at a position where all of the resin mask openings 25 arranged in the resin mask 20 can be seen.

Figure 12:
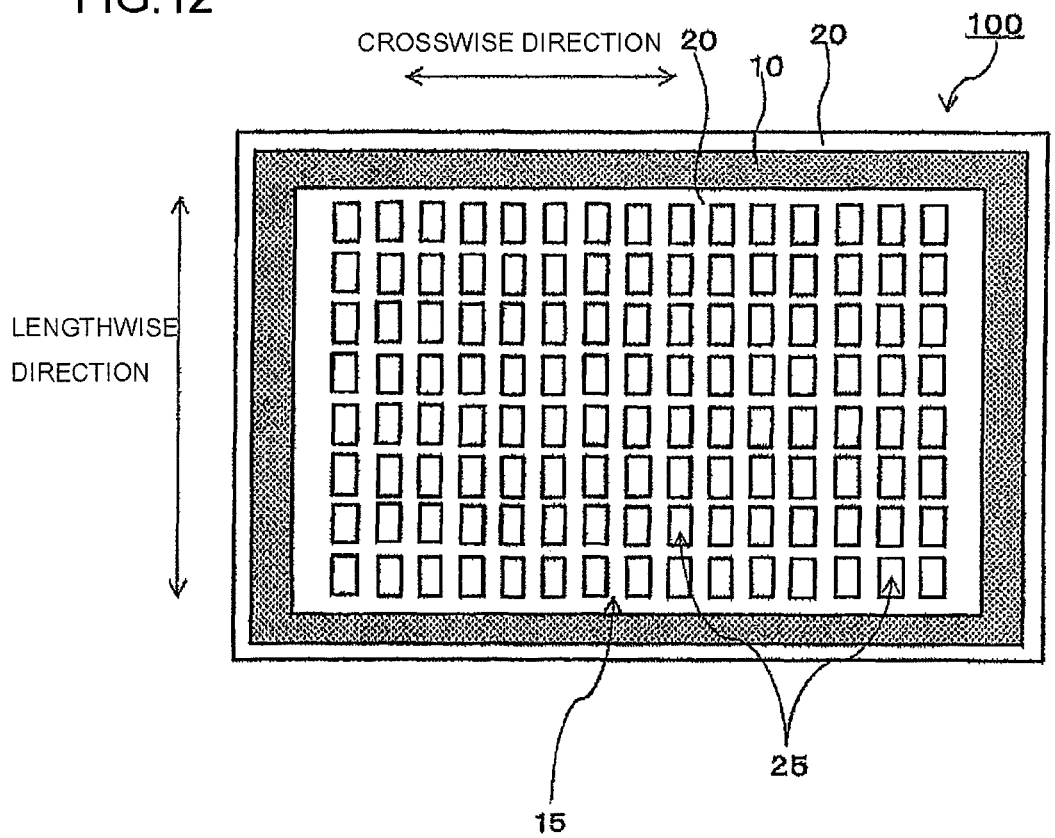
FIG. 12 is an elevation view exemplarily showing a vapor deposition mask of Embodiment (B) as seen from the metal mask side in plan view.

The metal portion constituting the metal mask 10, that is, the portion thereof other than the one metal mask opening 15 may be provided along the outer edge of the vapor deposition mask 100 as shown in FIG. 11, or the dimension of the metal mask 10 may be made smaller than that of the resin mask 20 to expose an outer circumferential portion of the resin mask 20 as shown in FIG. 12. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any cases, the dimension of the one metal mask opening 15 is configured to be smaller than the dimension of the resin mask 20.

While a width (W1), in the crosswise direction, and a width (W2), in the lengthwise direction, of the metal portion constituting the wall surface of the one metal mask opening 15 of the metal mask 10 shown in FIG. 11 are not specially limited but, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are within a range of not less than about 1 mm and not more than about 100 mm, which are similar to those for the metal mask in the vapor deposition mask of Embodiment (A).

While a case has been exemplarily described above in which the vapor deposition mask 100 is the vapor deposition mask 100 including the resin mask 20 including the resin mask openings 25 and the metal mask 10 including the metal mask openings 15, the resin mask and the metal mask being stacked, the vapor deposition mask may be a vapor deposition mask (not shown) constituted only of the resin mask 20, or a vapor deposition mask (not shown) constituted only of the metal mask 10. Also with these vapor deposition masks, generation of a shadow can be suppressed by setting the configuration of the resin mask opening 25 or the metal mask opening 15 to be a configuration that satisfies any one or both of the aforementioned "condition A" and "condition B". Moreover, it can also be applied to a vapor deposition mask containing a material different from a resin material and a metal material.

Specifically, there may be employed a configuration of a vapor deposition mask including openings corresponding to a pattern to be produced by vapor deposition, when a surface, of the surfaces of the vapor deposition mask, that is positioned on the vapor deposition source side is regarded as one surface of the vapor deposition mask, the vapor deposition mask including a plurality of openings, wherein as to any one opening of the plurality of openings, in a thicknesswise cross section of the vapor deposition mask, an acute angle formed by one inner wall surface forming the one opening and the other surface of the vapor deposition mask is different from an acute angle formed by the other inner wall surface forming the one opening and the other surface of the vapor deposition mask.

In place of the aforementioned configuration or in addition to this, there may be employed a configuration in which in a thicknesswise cross section of the vapor deposition mask, an acute angle formed by one inner wall surface of inner wall surfaces forming one opening of the plurality of openings and the other surface of the vapor deposition mask is different from an acute angle formed by one inner wall surface of inner wall surfaces forming another opening and the other surface of the vapor deposition mask.

When the vapor deposition mask is a vapor deposition mask constituted only of the resin mask 20, it only has to employ a configuration in which the metal mask 10 is removed from the vapor deposition mask described above. In this case, in order to secure rigidity of the vapor deposition mask, the thickness of the resin mask 20 is preferably not less than about 3 µm.

Moreover, when the vapor deposition mask is a vapor deposition mask constituted only of a metal mask, it only has to employ a configuration in which the resin mask 20 is removed from the vapor deposition mask described above, and a configuration of the metal mask openings 15 only has to be that of the metal mask openings 15 that satisfy any one or both of the aforementioned "condition A" and "condition B". The thickness of the metal mask 10 in this case is preferably within a range not less than about 5 µm and not more than about 35 µm.

Notably, with precision of openings corresponding to a pattern to be produced by vapor deposition taken into consideration, the openings corresponding to the pattern to be produced by vapor deposition are preferably the resin mask openings 25 included in the resin mask 20. Moreover, with a point of rigidity taken into consideration, the metal mask 10 including the metal mask openings 15 is preferably stacked on one surface of the resin mask 20.

<Frame-Equipped Vapor Deposition Mask>

A frame-equipped vapor deposition mask 200 according to an embodiment of the present disclosure exhibits a configuration in which the vapor deposition mask 100 according to each embodiment of the present disclosure described above is fixed to a frame 60. Description of the vapor deposition mask 100 is omitted.

Figure 13:
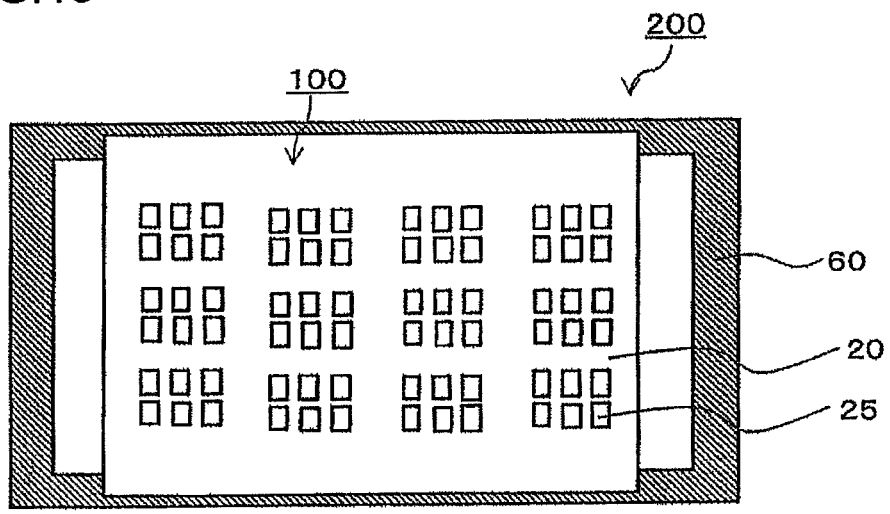
FIG. 13 is an elevation view exemplarily showing a frame-equipped vapor deposition mask.
Figure 14:
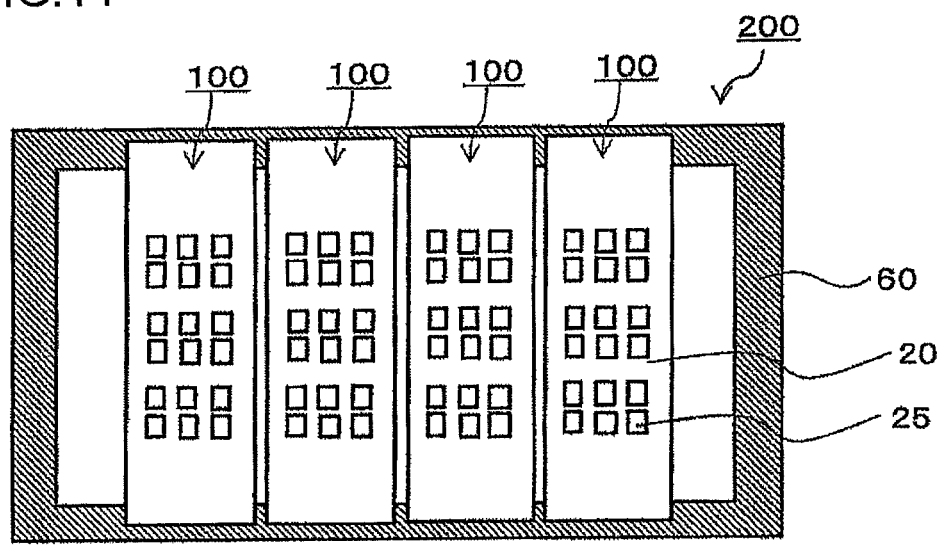
FIG. 14 is an elevation view exemplarily showing a frame-equipped vapor deposition mask.

In the frame-equipped vapor deposition mask 200, one vapor deposition mask 100 may be fixed to the frame 60 as shown in FIG. 13, or a plurality of vapor deposition masks 100 may be fixed to the frame 60 as shown in FIG. 14.

The frame 60 is a substantially rectangular frame member and includes a through hole for exposing, to the vapor deposition source side, the resin mask openings 25 provided in the resin mask 20 of the vapor deposition mask 100 to be fixed in the final stage. As the material of the frame, a metal material, a glass material, a ceramic material and the like can be cited.

The thickness of the frame is not specially limited but is preferably within a range not less than about 10 mm and not more than about 30 mm in view of its rigidity and the like. The width between the inner circumferential end face of the opening of the frame and the outer circumferential end face of the frame is not specially limited as long as it is a width at which the metal mask of the vapor deposition mask can be fixed to the frame, but, for example, is within a range not less than about 10 mm and not more than about 70 mm.

Figure 15A:
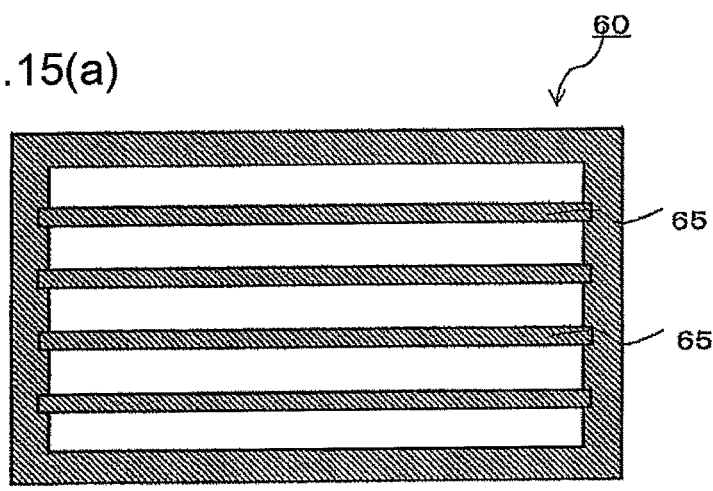
FIGS. 15(a) to 15(c) are elevation views exemplarily showing a frame.
Figure 15B:
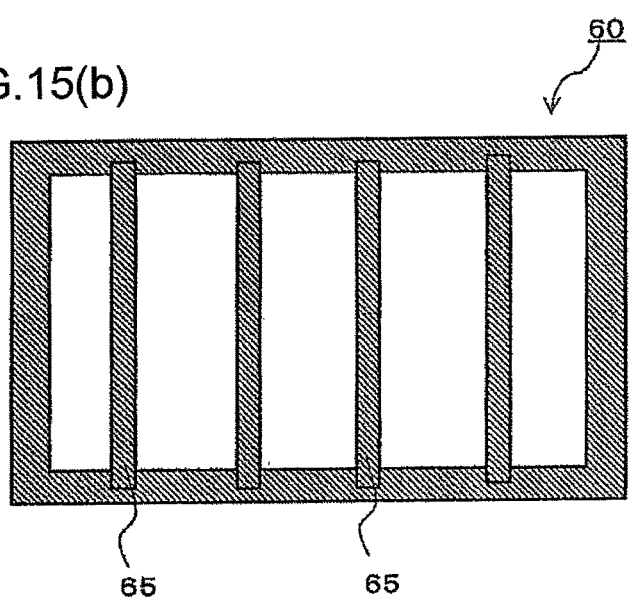
Figure 15C:
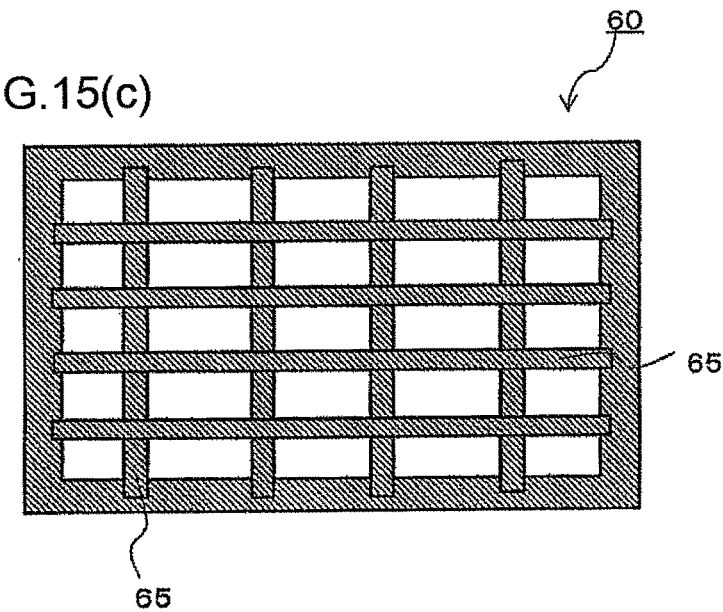

Moreover, as shown in FIGS. 15(a) to 15(c), the frame 60 in which reinforcement frames 65 and the like are provided in the region of the through hole of the frame may be used. In other words, a configuration in which the opening included in the frame 60 is divided by the reinforcement frames and the like may be included. To provide the reinforcement frames 65 also enables the frame 60 and the vapor deposition mask 100 to be fixed to each other using the reinforcement frames 65. Specifically, when a plurality of vapor deposition masks 100 described above are arranged and fixed in the lengthwise direction and the crosswise direction, the vapor deposition mask 100 can be fixed to the frame 60 also at positions where the reinforcement frames and the vapor deposition masks overlap with each other.

A fixing method of the vapor deposition mask 100 to the frame 60 is not specially limited but the fixation can be performed using spot welding for fixation with laser light or the like, an adhesive agent, screw fastening, or other methods.

<Vapor Deposition Method Using Vapor Deposition Mask>

A vapor deposition method used for forming a vapor deposition pattern using the vapor deposition mask according to each embodiment of the present disclosure is not specially limited but, for example, physical vapor deposition (PVD) methods such as a reactive sputtering method, a vacuum vapor deposition method, ion plating, and an electron beam vapor deposition method, chemical vapor deposition (CVD) methods such as thermal CVD, plasma CVD and photo-CVD methods, and the like can be cited. Moreover, a vapor deposition pattern can be formed using a conventionally known vacuum vapor deposition apparatus or the like.

<<Method for Producing Vapor Deposition Mask>>

Next, a method for producing a vapor deposition mask according to an embodiment of the present disclosure is described.

In the method for producing a vapor deposition mask according to an embodiment of the present disclosure, a resin plate for forming the resin mask described above is prepared. The aforementioned description applies to the material and the thickness of this resin plate, and their description is herein omitted.

Notably, the prepared resin plate may be a resin plate only, may be a metal mask-equipped resin plate in which the metal mask described above is stacked on one surface of a resin plate, or may be a metal layer-equipped resin plate in which a metal layer described below is provided on a part of one surface of a resin plate.

In the method for producing a vapor deposition mask according to an embodiment of the present disclosure, by radiating a laser onto the prepared resin plate, a step of forming a plurality of resin mask openings in the resin plate is performed. Herein, when a metal mask is stacked on the prepared resin plate, the laser is radiated through a metal mask opening of the metal mask. Moreover, when a metal layer described below is provided on the prepared resin plate, the laser is radiated from the side on which the metal layer is provided.

Further, in the step of forming the plurality of resin mask openings in the resin plate, openings are formed such that the formed resin mask openings satisfy any one or both of the aforementioned "condition A" and "condition B".

A specific device which forms openings satisfying any one or both of the aforementioned "condition A" and "condition B" is not specially limited but, for example, devices as exemplified below may be used.

—Radiating Laser at Angle

Figure 20A:
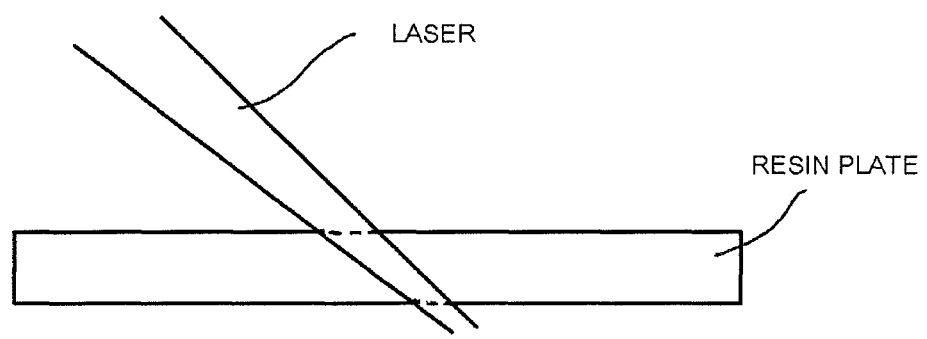
FIG. 20 is a diagram for explaining a method for producing a vapor deposition mask of the present disclosure.
Figure 20B:
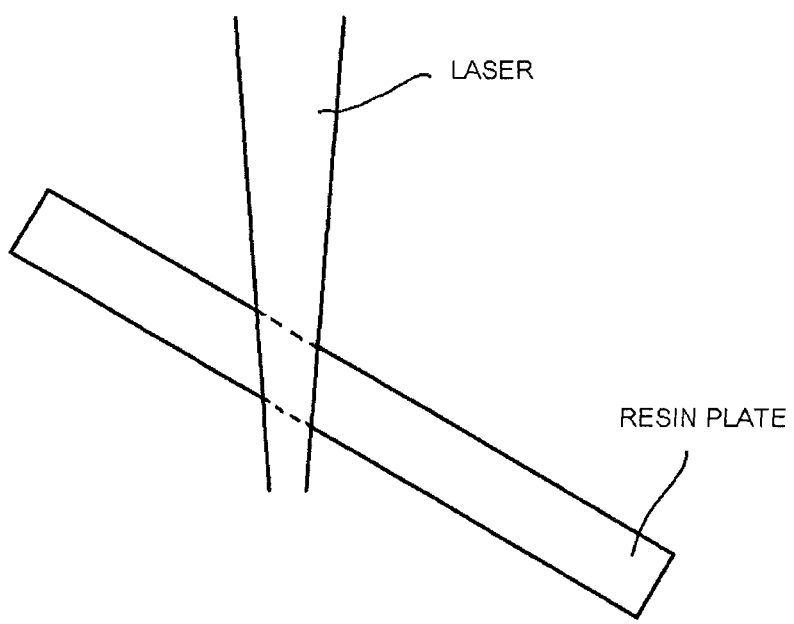

As shown in FIGS. 20(a) and 20(b), when a laser is radiated onto the resin plate, by radiating it at an angle, an opening can be formed so as to satisfy any one or both of the aforementioned "condition A" and "condition B". Notably, when such an angle is applied, the laser itself may be at the angle as shown in FIG. 20(a), or the laser itself may be radiated from right above to install the resin plate at the angle as shown in FIG. 20(b). Moreover, not shown, a reflector or the like can also be used to change the optical path of the radiated laser, and thereby, to apply the angle to the laser.

—Radiating Laser in Stages

Figure 21:
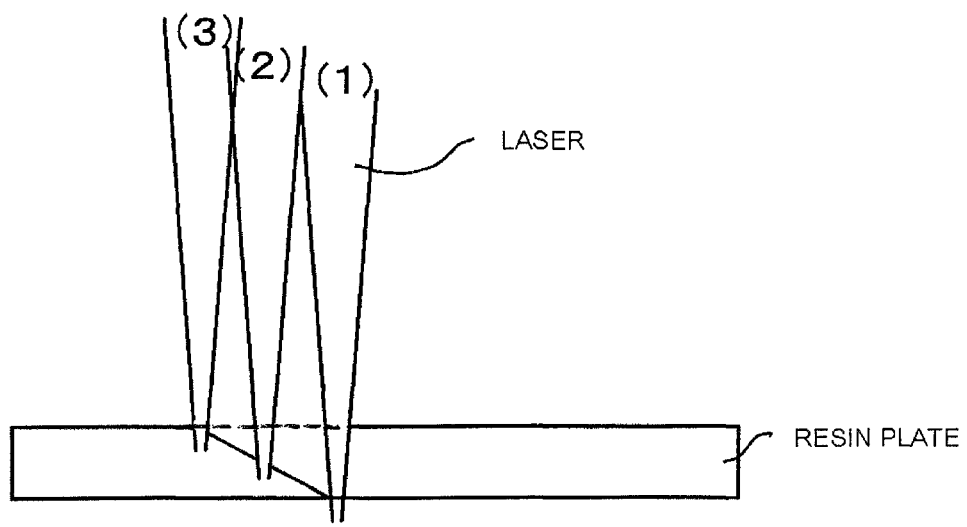
FIG. 21 is a diagram for explaining a method for producing a vapor deposition mask of the present disclosure.

When a laser is radiated onto the resin plate as shown in FIG. 21, by radiating the laser in stages as indicated by (1), (2), (3) . . . in FIG. 21, an opening can be formed so as to satisfy any one or both of the aforementioned "condition A" and "condition B". In this case, by making the focal distance of the laser shallower while shifting the position of its projection, a desired opening may be formed, or by changing the energy of the radiated laser while shifting the position of the laser, a desired opening may be formed.

—Using Laser Mask

Figure 22:
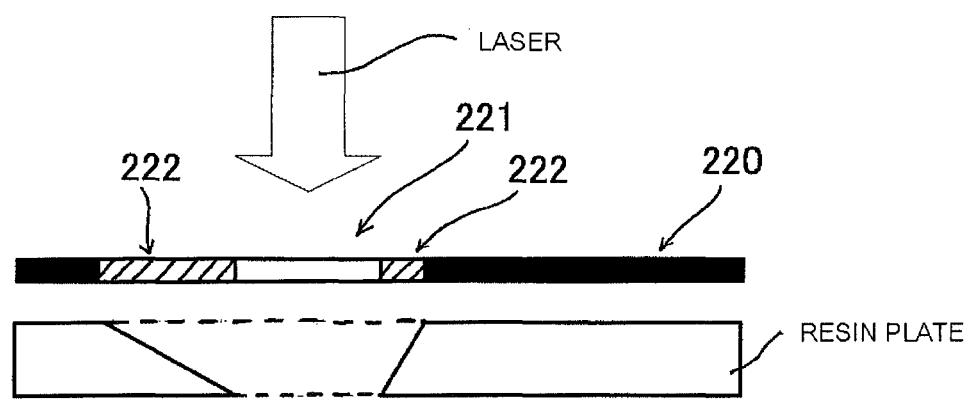
FIG. 22 is a diagram for explaining a method for producing a vapor deposition mask of the present disclosure.

As shown in FIG. 22, when a laser is radiated onto the resin plate, a laser mask 220 can be installed above the resin plate to project the laser through the laser mask 220, and thereby, an opening can be formed so as to satisfy any one or both of the aforementioned "condition A" and "condition B". More specifically, in this laser mask, an opening region 221 which allows the laser to pass through as it is without attenuating its energy, and an attenuating region 222 which is positioned around the opening region 221 and attenuates the energy of the laser are provided. By using the laser mask including such an attenuating region 222, since the energy of the laser having passed through the attenuating region 222 is attenuated, in timing when an opening has been formed with the laser having passed through the opening region, there can be achieved the state where the surroundings of the opening have not been penetrated yet, and in this way, the opening can be formed so as to satisfy any one or both of the aforementioned "condition A" and "condition B". A method of forming such an attenuating region 222 is not specially limited but, for example, a technology of a halftone mask or the like can be applied, and by properly designing the rate of attenuation with this attenuating region 222 and the arrangement of the attenuating region 222, the opening can be formed so as to satisfy any one or both of the aforementioned "condition A" and "condition B".

<<Method for Producing Organic Semiconductor Element>>

Next, a method for producing an organic semiconductor element according to an embodiment of the present disclosure is described. A method for producing an organic semiconductor element of the present disclosure includes a step of forming a vapor deposition pattern on a vapor deposition target using a vapor deposition mask, and in the vapor deposition pattern forming step of forming the vapor deposition pattern, the vapor deposition mask according to each embodiment of the present disclosure described above is used.

The vapor deposition pattern forming steps forming a vapor deposition pattern by a vapor deposition method using the vapor deposition mask are not specially limited but include an electrode forming step, an organic layer forming step, a counter electrode forming step, a sealing layer forming step and the like in which electrodes are formed on a substrate, and in any of the steps, the vapor deposition pattern is formed using the vapor deposition pattern forming method of the present disclosure described above. For example, in the case where the step of forming a vapor deposition pattern of the present disclosure described above is applied to each of light-emitting layer forming steps for colors of R (red), G (green) and B (blue) in an organic EL device, vapor deposition patterns are formed for light-emitting layers for the colors on the substrate. Notably, the method for producing an organic semiconductor element of the present disclosure is not limited to be applied to these steps, but to any steps in conventionally known production of an organic semiconductor element.

According to the method for producing an organic semiconductor element according to an embodiment of the present disclosure described above, vapor deposition for forming an organic semiconductor element can be performed in the state where the vapor deposition mask is brought into close contact with a vapor deposition target without a gap, and an organic semiconductor element with high definition can be produced. As organic semiconductor elements produced by the method for producing an organic semiconductor element of the present disclosure, for example, organic layers, light-emitting layers, cathode electrodes and the like of organic EL elements can be cited. In particular, the method for producing an organic semiconductor element of the present disclosure can be preferably used for production of R (red), G (green) and B (blue) light-emitting layers of organic EL devices which require pattern precision with high definition.

<<Method for Producing Organic EL Display>>

Next, a method for producing an organic EL display (organic electroluminescence display) according to an embodiment of the present disclosure is described. In the method for producing an organic EL display according to the present disclosure, the organic semiconductor element produced by the method for producing an organic semiconductor element according to the present disclosure described above is used in a step of producing the organic EL display.

Figure 16A:
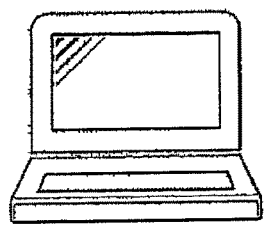
FIG. 16 shows diagrams showing examples of devices including organic EL displays.
Figure 16B:
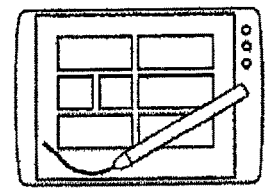
Figure 16C:
Figure 16D:
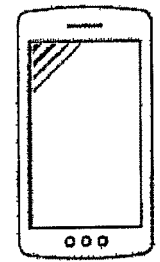
Figure 16E:
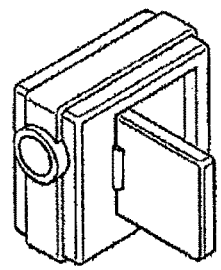
Figure 16F:
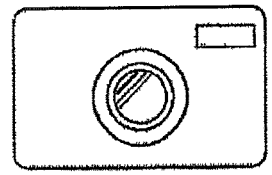
Figure 16G:
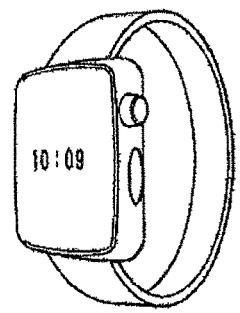

As the organic EL displays in which the organic semiconductor elements produced by the aforementioned method for producing an organic semiconductor element according to the present disclosure are used, for example, organic EL displays used for a notebook-sized personal computer (refer to FIG. 16(a)), a tablet terminal (refer to FIG. 16(b)), a mobile phone (refer to FIG. 16(c)), a smartphone (refer to FIG. 16(d)), a video camera (refer to FIG. 16(e)), a digital camera (refer to FIG. 16(f)), a smartwatch (refer to FIG. 16(g)) and the like can be cited.

While there have been mainly described as above the cases where the vapor deposition mask according to an embodiment of the present disclosure and the vapor deposition mask used for the method for producing an organic semiconductor element and the method for producing an organic EL display are vapor deposition masks in a stacking configuration in which the resin mask 20 including the resin mask openings 25 and the metal mask 10 including the metal mask openings 15 are stacked, in place of the vapor deposition mask in this mode, the vapor deposition mask according to an embodiment of the present disclosure may be a vapor deposition mask in a mode in which a metal layer 10A is partially arranged on the resin mask 20 including the resin mask openings 25. Moreover, the vapor deposition mask in this mode can also be used for the method for producing an organic semiconductor element and the method for producing an organic EL display. Notably, the resin mask openings 25 in this mode also satisfy any one or both of the aforementioned "condition A" and "condition B".

According to the vapor deposition mask in which the metal layer 10A is partially arranged on the resin mask 20 including the resin mask openings 25, durability can be improved as compared with a vapor deposition mask not including the metal layer 10A, in other words, a vapor deposition mask constituted only of the resin mask 20.

Figure 17A:
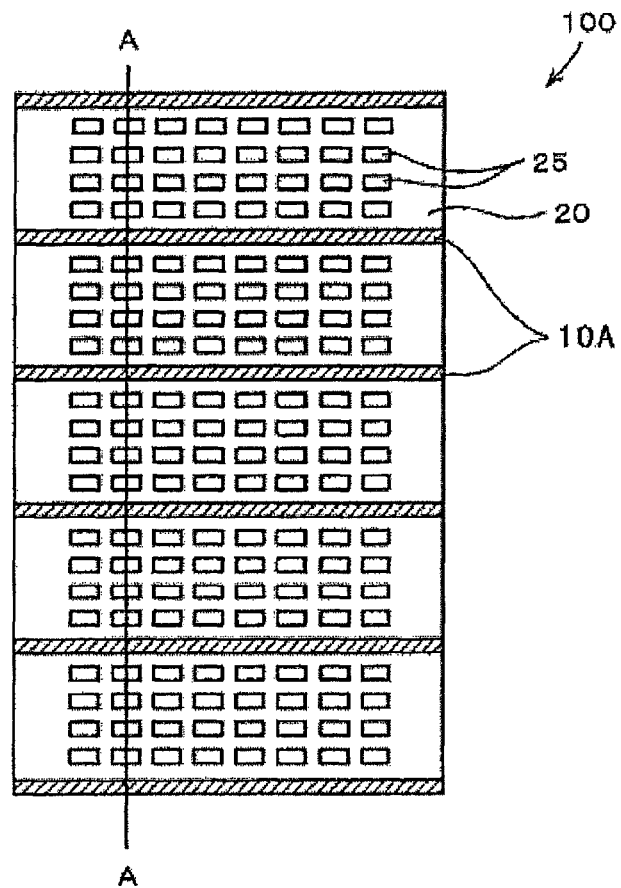
FIG. 17(a) is an elevation view exemplarily showing a vapor deposition mask of the present disclosure as seen from the metal layer side in plan view.
Figure 17B:
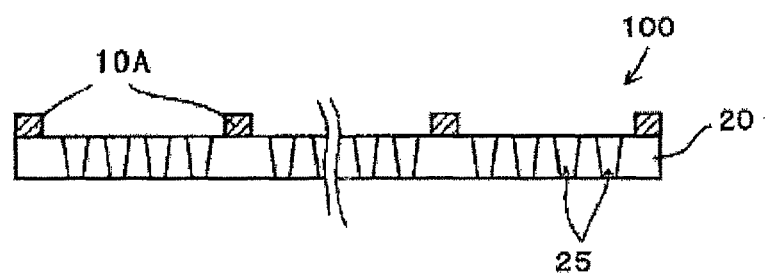
FIG. 17(b) is a schematic cross-sectional view taken along the line A-A in FIG. 17(a).

FIG. 17(a) is an elevation view exemplarily showing the vapor deposition mask in the mode in which the metal layer 10A is partially arranged on the resin mask 20 including the resin mask openings 25 as seen from the metal layer side in plan view, and FIG. 17(b) is a schematic cross-sectional view in the A-A portion of FIG. 17(a). Notably, a part about the center of the vapor deposition mask is omitted in FIG. 17(b). Moreover, while in FIG. 17(b), the shapes of the inner wall surfaces of the resin mask openings 25 in cross-sectional view are briefly shown, the resin mask openings 25 satisfy any one or both of the aforementioned "condition A" and "condition B".

The position where the metal layer 10A is provided and the shape of the metal layer 10A in plan view are not specially limited. Namely, the planar shape of the metal layer 10A can be properly designed in accordance with the position where the metal layer 10A is provided.

For example, when as shown in FIG. 17(a), the shape of the resin mask 20 constituting the vapor deposition mask 100 in plan view exhibits a rectangular shape including long sides and short sides, the metal layer 10A may be arranged to be parallel to the short side of the resin mask 20 while its shape is a band shape with the same length as that of the short side. Moreover, not shown, the metal layer 10A may be arranged to be parallel to the long side of the resin mask while its shape is a band shape with the same length as that of the long side of the resin mask 20.

Figure 18:
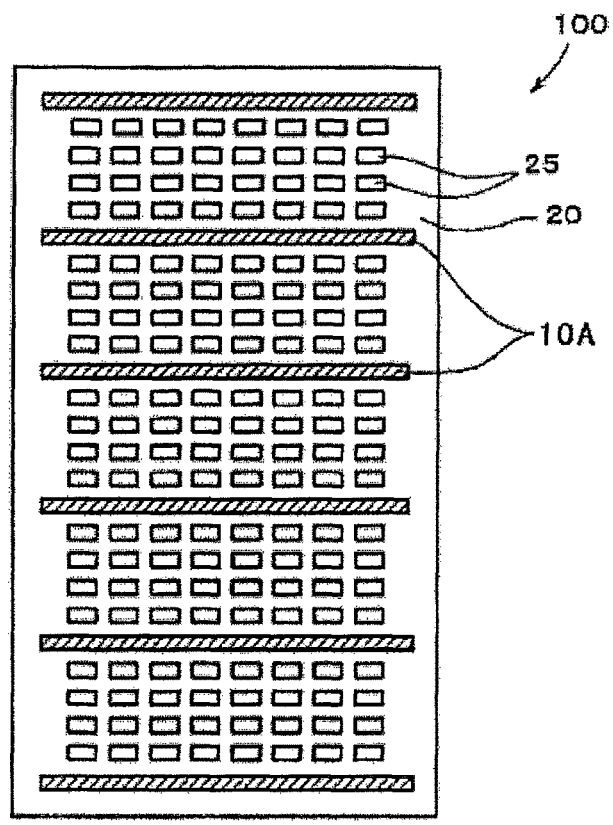
FIG. 18 is an elevation view exemplarily showing a vapor deposition mask of the present disclosure as seen from the metal layer side in plan view.
Figure 19:
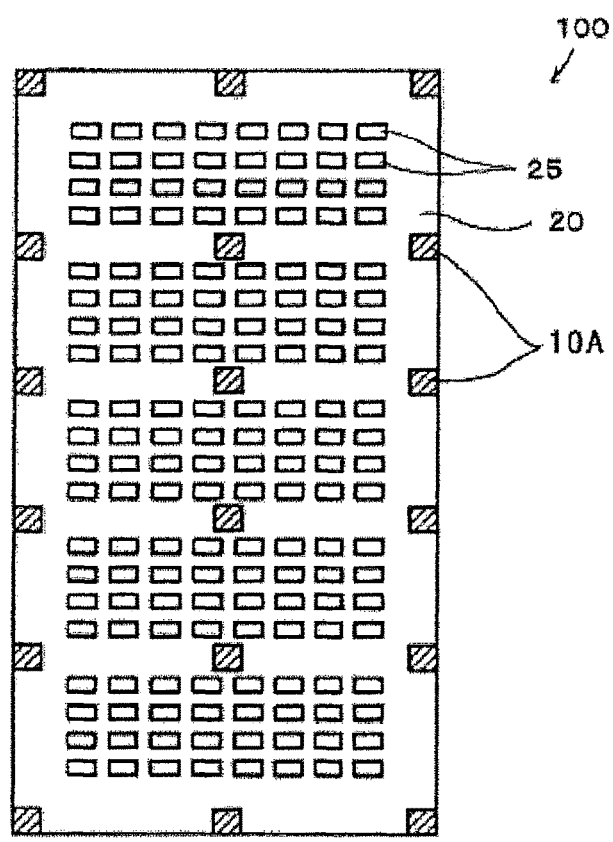
FIG. 19 is an elevation view exemplarily showing a vapor deposition mask of the present disclosure as seen from the metal layer side in plan view.

Each of FIG. 18 and FIG. 19 is an elevation view exemplarily showing a vapor deposition mask in which metal layers 10A are partially arranged on the resin mask 20 including the resin mask openings 25 as seen from metal layer 10A side in plan view.

As shown in FIG. 18, the metal layer 10A is not necessarily in contact with the peripheral edge of the resin mask 20 but may be arranged only inward of the resin mask 20. For example, when the vapor deposition mask in which the metal layers 10A are partially arranged on the resin mask 20 including the resin mask openings 25 is fixed to a frame, there may be a mode in which the metal layers 10A are not arranged at positions overlapping with the frame in the thicknesswise direction.

Moreover, as shown in FIG. 19, the metal layers 10A are not necessarily band-shaped but may be arranged to be scattered on the resin mask 20. In this case, while the metal layer 10A shown in FIG. 19 is square, not limited to this, any shapes can be employed, such as a rectangle, a triangle, polygons other than triangles, a circle, an ellipse, a semicircle, a torus, a "C"-shape, a "T"-shape, a "cross" shape and a "star" shape. When a plurality of metal layers 10A are provided on one resin mask 20, all the metal layers 10A are not necessarily in the same shapes but the metal layers 10A in various shapes as exemplified above may be mixed.

Moreover, the metal layers 10A may be regularly arranged or may be arranged at random.

As the material of the metal layer 10A, the aforementioned material of the metal mask 10 can still be used. Moreover, the thickness of the metal layer 10A only has to be the thickness described for the metal mask 10.

Moreover, the sectional shape of the metal layer 10A is not specially limited but, as shown in FIG. 17(b), the opposing end surfaces of the metal layer 10A may be substantially parallel to each other, and not shown, similarly to the openings of the resin mask opening 25 and the metal mask opening 15, there may be a shape including broadening toward the surface, of the metal layer 10A, that is not in contact with the resin mask 20 from the surface, of the metal layer 10A, that is in contact with the resin mask 20.

REFERENCE SIGNS LIST

10 Metal mask
15 Metal mask opening
20 Resin mask
25, 25a, 25b, 25c, 25d Resin mask opening
60 Frame
100 Vapor deposition mask

The invention claimed is:

1. A method for producing a vapor deposition mask including a resin mask including resin mask openings corresponding to a pattern to be produced by vapor deposition, and a metal mask including a metal mask opening, the metal mask being stacked on one surface of the resin mask, the method comprising:
    a step of preparing a metal mask-equipped resin plate in which the metal mask is stacked on one surface of a resin plate; and
    a step of forming a plurality of resin mask openings in the resin plate by radiating a laser in an irradiation direction onto the resin plate through the metal mask opening of the metal mask-equipped resin plate, wherein the irradiation direction and the resin plate form an acute angle;
    wherein in the step of forming the plurality of resin mask openings,
    at least one resin mask opening of the plurality of resin mask openings is formed such that in a thicknesswise cross section of the resin mask, a first acute angle is formed on a first surface of an inner wall of the resin mask forming the at least one resin mask opening, and a second acute angle is formed on a second surface of the inner wall of the resin mask forming the at least one resin mask opening; wherein the first acute angle is different from the second acute angle.

2. A method for producing an organic semiconductor element, the method comprising:
    a vapor deposition pattern forming step of forming a vapor deposition pattern on a vapor deposition target using a vapor deposition mask, wherein the vapor deposition mask used in the vapor deposition pattern forming step is the vapor deposition mask produced by the method for producing a vapor deposition mask according to claim 1.

3. A method for producing an organic EL display, wherein the organic semiconductor element produced by the method for producing an organic semiconductor element according to claim 2 is used.

4. A method for producing a vapor deposition mask including a resin mask including resin mask openings corresponding to a pattern to be produced by vapor deposition, and a metal mask including a metal mask opening, the metal mask being stacked on one surface of the resin mask, the method comprising:
    a step of preparing a metal mask-equipped resin plate in which the metal mask is stacked on one surface of a resin plate; and
    a step of forming a plurality of resin mask openings in the resin plate by radiating a laser in an irradiation direction onto the resin plate through the metal mask opening of the metal mask-equipped resin plate, wherein the irradiation direction and the resin plate form an acute angle;
    wherein in the step of forming the plurality of resin mask openings,
    the resin mask is formed such that in a thicknesswise cross section of the resin mask, a first acute angle is formed on a first inner wall surface of the resin mask forming first resin mask opening of the plurality of resin mask openings, and a second acute angle is formed on a second inner wall surface of the resin mask forming a second resin mask opening of the resin mask; wherein the first acute angle is different from the second acute angle.

5. The method for producing a vapor deposition mask according to claim 4, wherein in the step of forming the plurality of resin mask openings,
    the resin mask is formed such that in a thicknesswise cross section of the resin mask, a third acute angle is formed on a third inner wall surface of the resin mask forming the first resin mask opening; wherein the first acute angle is different from the third acute angle.

6. A method for producing a vapor deposition mask including openings corresponding to a pattern to be produced by vapor deposition, the method comprising:
    a step of preparing a resin plate; and
    a step of forming a plurality of openings in the resin plate by radiating a laser in an irradiation direction onto the resin plate, wherein the irradiation direction and the resin plate form an acute angle;
    wherein in the step of forming the plurality of openings,
    a surface of surfaces of the vapor deposition mask, that is positioned on a vapor deposition source side is regarded as one surface of the vapor deposition mask,
    at least one opening of the plurality of openings is formed such that in a thicknesswise cross section of the vapor deposition mask, a first acute angle is formed on a first surface of an inner wall of the resin mask forming the at least one opening of the vapor deposition mask, and a second acute angle is formed on a second surface of the inner wall of the resin mask forming the at least one opening of the vapor deposition mask; wherein the first acute angle is different from the second acute angle.

7. A method for producing a vapor deposition mask including openings corresponding to a pattern to be produced by vapor deposition, the method comprising:

a step of preparing a resin plate; and a step of forming a plurality of openings in the resin plate by radiating a laser in an irradiation direction onto the resin plate, wherein the irradiation direction and the resin plate form an acute angle;

wherein in the step of forming the plurality of openings, a surface of surfaces of the vapor deposition mask, that is positioned on a vapor deposition source side is regarded as one surface of the vapor deposition mask, at least one opening of the plurality of openings is formed such that in a thicknesswise cross section of the vapor deposition mask, a first acute angle is formed on a first inner wall surface of the resin mask forming a first opening of the plurality of openings of the vapor deposition mask, and a second acute angle is formed on a second inner wall surface of the resin mask forming a second opening of the vapor deposition mask; wherein the first acute angle is different from the second acute angle.

8. The method for producing a vapor deposition mask according to claim 7, wherein in the step of forming the plurality of openings, the at least one opening of the plurality of openings is formed such that in a thicknesswise cross section of the vapor deposition mask, a third acute angle is formed on a third inner wall surface of the resin mask forming the first opening; wherein the first acute angle is different from the third acute angle.

\* \* \* \* \*